United States Patent
Son

(10) Patent No.: US 11,387,246 B2
(45) Date of Patent: Jul. 12, 2022

(54) SEMICONDUCTOR DEVICE INCLUDING DATA STORAGE PATTERN

(71) Applicant: Samsung Electronics Co., Ltd., Suwon-si (KR)

(72) Inventor: Yonghoon Son, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 88 days.

(21) Appl. No.: 16/890,228

(22) Filed: Jun. 2, 2020

(65) Prior Publication Data
US 2020/0395367 A1 Dec. 17, 2020

(30) Foreign Application Priority Data

Jun. 17, 2019 (KR) .................. 10-2019-0071587

(51) Int. Cl.
*H01L 27/11578* (2017.01)
*H01L 27/1157* (2017.01)
*H01L 27/11565* (2017.01)

(52) U.S. Cl.
CPC .... *H01L 27/1157* (2013.01); *H01L 27/11565* (2013.01); *H01L 27/11578* (2013.01)

(58) Field of Classification Search
CPC .......... H01L 27/1157; H01L 27/11565; H01L 27/11578; H01L 27/11582; H01L 29/42332; H01L 29/42348; H01L 27/11556; H01L 27/0688; H01L 27/11524; H01L 29/788
See application file for complete search history.

(56) References Cited

U.S. PATENT DOCUMENTS

| 8,017,993 B2 | 9/2011 | Kidoh et al. |
| 8,349,681 B2 | 1/2013 | Alsmeier et al. |
| 10,032,935 B2 | 7/2018 | Higuchi et al. |
| 2009/0121271 A1* | 5/2009 | Son ............... H01L 21/8221 257/315 |
| 2010/0155826 A1* | 6/2010 | Wenxu ........... H01L 27/11578 257/326 |

(Continued)

FOREIGN PATENT DOCUMENTS

JP   2011-023586 A   2/2011

*Primary Examiner* — Shahed Ahmed
*Assistant Examiner* — Khatib A Rahman
(74) *Attorney, Agent, or Firm* — Harness, Dickey & Pierce, P.L.C.

(57) ABSTRACT

A semiconductor device includes a vertical pattern in a first direction, interlayer insulating layers, spaced apart, a side surface of each of the interlayer insulating layers facing a side of the vertical pattern, a gate electrode between the interlayer insulating layers, a side of the gate electrode facing the side of the vertical pattern, a dielectric structure between the vertical pattern and the interlayer insulating layers with the gate electrode between the interlayer insulating layers, and data storage patterns between the gate electrode and the vertical pattern, the data storage patterns spaced apart. The dielectric structure includes a first and a second dielectric layers, the second dielectric layer between the first dielectric layer and the vertical pattern. The data storage patterns are between the first dielectric layer and the second dielectric layer. The first dielectric layer includes portions between the data storage patterns and the gate electrode.

20 Claims, 29 Drawing Sheets

(56) References Cited

U.S. PATENT DOCUMENTS

| | | | |
|---|---|---|---|
| 2011/0291172 A1* | 12/2011 | Hwang | H01L 27/11582 257/314 |
| 2013/0037774 A1* | 2/2013 | Song | H01L 27/249 257/2 |
| 2013/0134492 A1* | 5/2013 | Yang | H01L 27/1157 257/314 |
| 2013/0270643 A1* | 10/2013 | Lee | H01L 27/11582 257/365 |
| 2016/0043095 A1 | 2/2016 | Yang et al. | |
| 2016/0049422 A1* | 2/2016 | Kim | H01L 27/1157 257/324 |
| 2016/0104719 A1* | 4/2016 | Jung | H01L 27/11578 257/324 |
| 2016/0268387 A1 | 9/2016 | Toh et al. | |
| 2017/0263613 A1* | 9/2017 | Murakoshi | H01L 27/11575 |
| 2017/0263780 A1* | 9/2017 | Sawa | H01L 29/66825 |
| 2017/0338238 A1* | 11/2017 | Zhang | H01L 27/11519 |
| 2018/0006050 A1 | 1/2018 | Watanabe et al. | |
| 2018/0012902 A1* | 1/2018 | Choi | H01L 27/1157 |
| 2019/0027493 A1 | 1/2019 | Kimura et al. | |

* cited by examiner

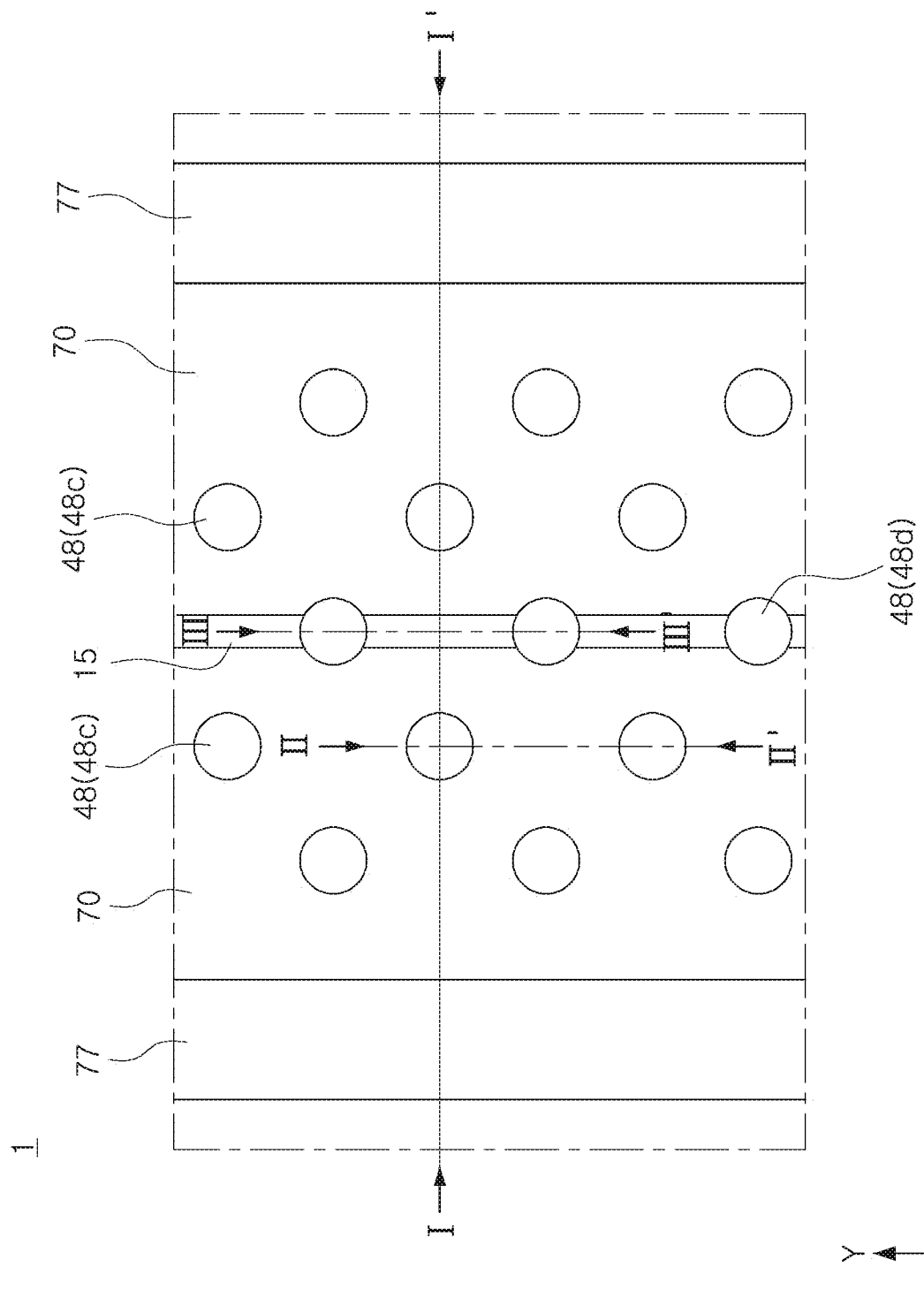

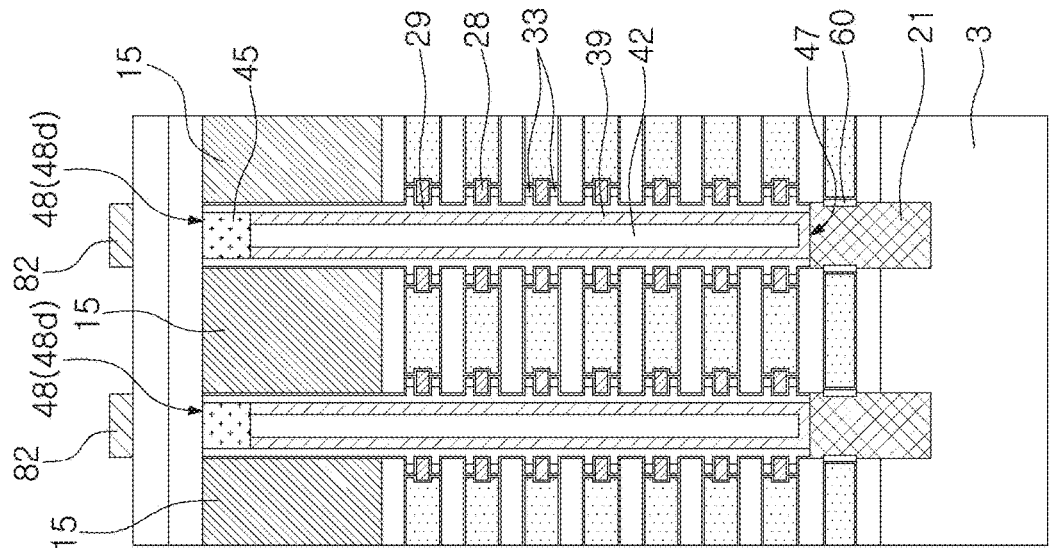
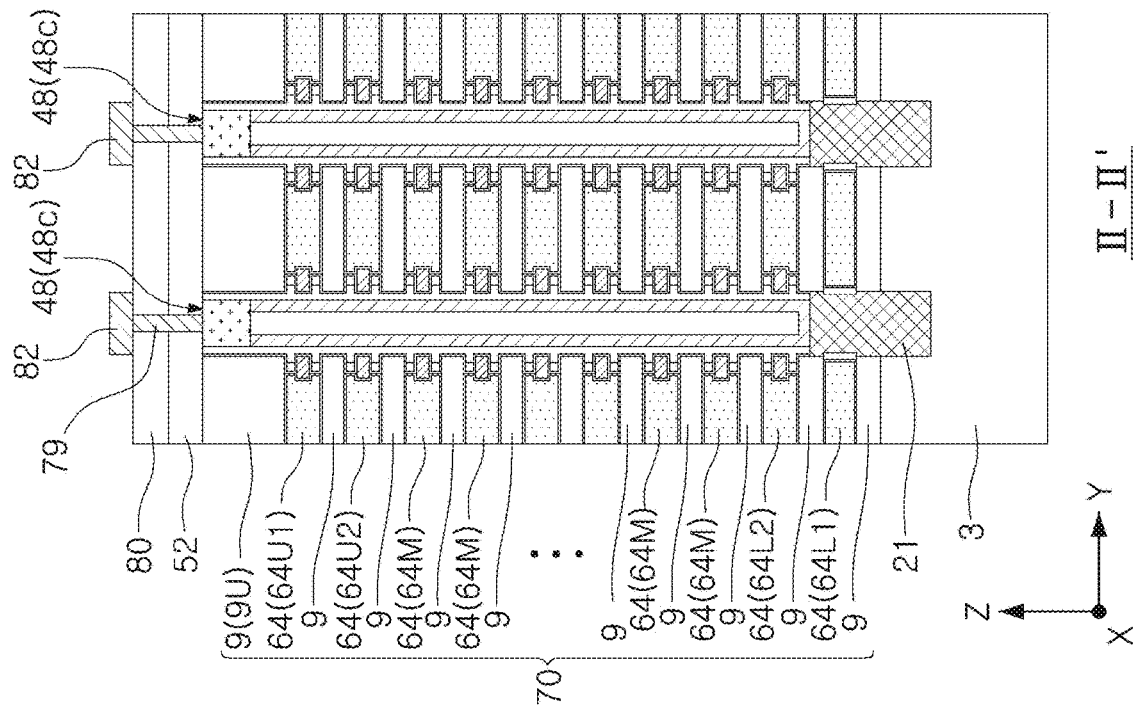
FIG. 2B

I – I'

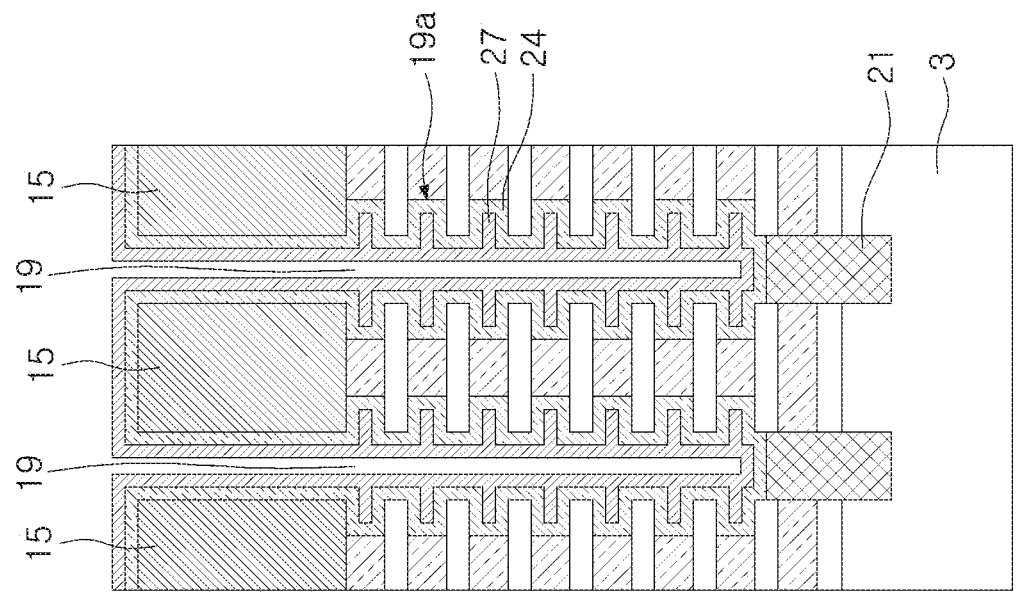
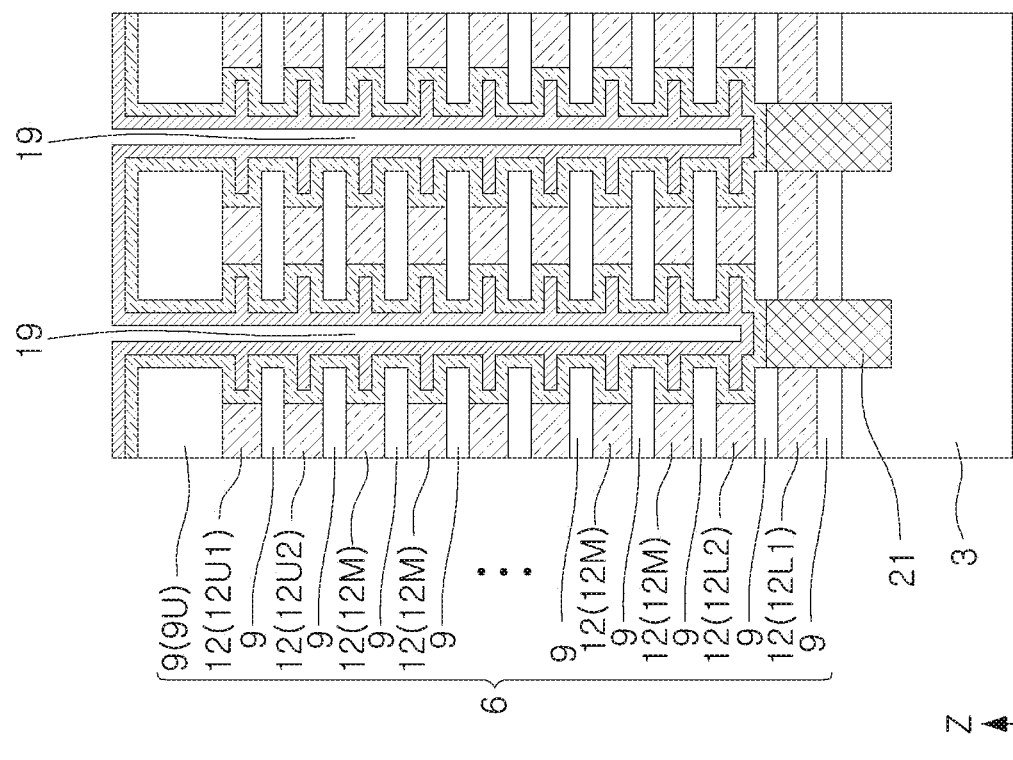
FIG. 11B

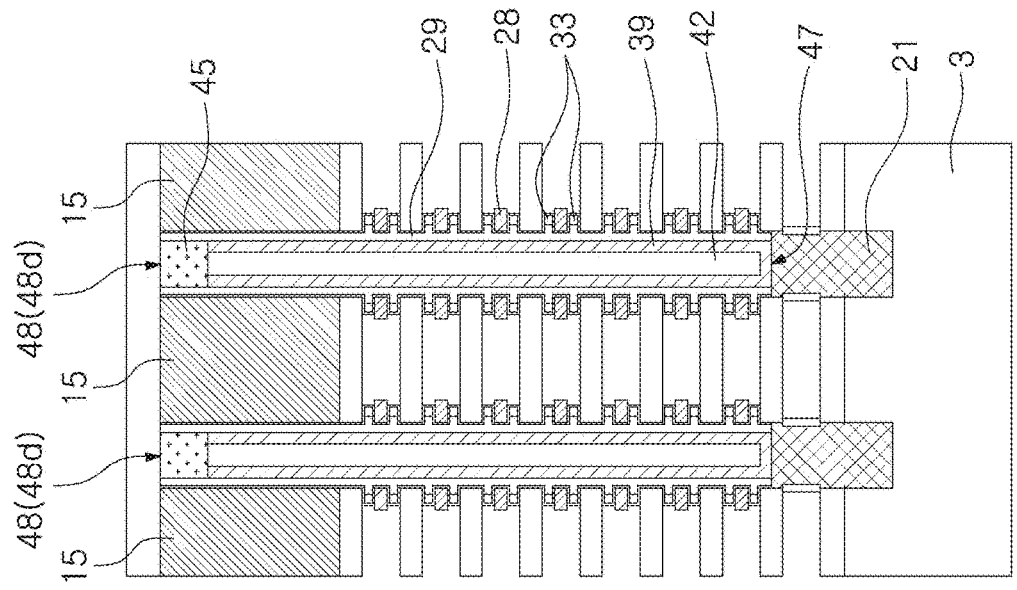
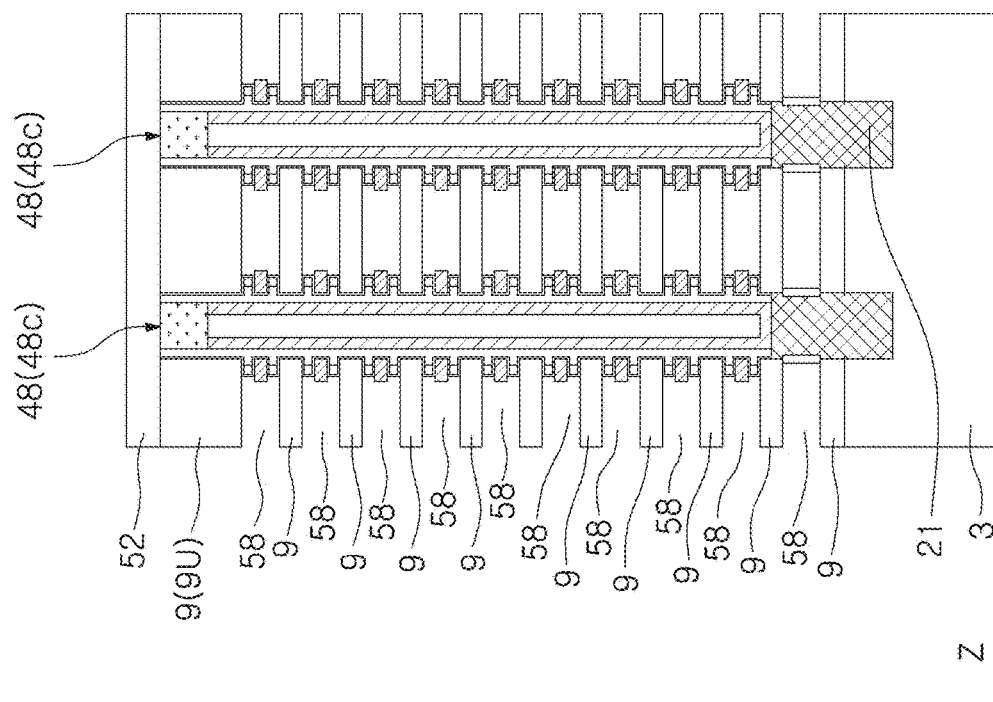
FIG. 14B

SEMICONDUCTOR DEVICE INCLUDING DATA STORAGE PATTERN

CROSS-REFERENCE TO RELATED APPLICATION(S)

This application claims benefit of priority to Korean Patent Application No. 10-2019-0071587 filed on Jun. 17, 2019 in the Korean Intellectual Property Office, the disclosure of which is incorporated herein by reference in its entirety.

BACKGROUND

The disclosure relates to semiconductor devices, and more particularly, to semiconductor devices including data storage patterns and methods of fabricating the same.

To provide cost-effective products, there is increasing demand for semiconductor devices having improved integration density. A semiconductor device, including memory cells arranged three-dimensionally rather than two-dimensionally, has been proposed to improve the integration density of a semiconductor device.

SUMMARY

Example embodiments provide a semiconductor device including data storage patterns arranged three-dimensionally.

Example embodiments provide a semiconductor device which may improve integration density.

Example embodiments provide a method of fabricating a semiconductor device including a plurality of data storage patterns.

According to some example embodiments, a semiconductor device includes a vertical pattern extending in a first direction, interlayer insulating layers, spaced apart from each other in the first direction, a side surface of each of the interlayer insulating layers facing a side surface of the vertical pattern, a gate electrode between the interlayer insulating layers, a side surface of the gate electrode facing the side surface of the vertical pattern, a dielectric structure between the vertical pattern and the interlayer insulating layers with the gate electrode between the interlayer insulating layers, and a plurality of data storage patterns between the gate electrode and the vertical pattern, the plurality of data storage patterns spaced apart from each other in the first direction. The dielectric structure includes a first dielectric layer and a second dielectric layer, the second dielectric layer between the first dielectric layer and the vertical pattern. The plurality of data storage patterns are between the first dielectric layer and the second dielectric layer. The first dielectric layer includes a plurality of portions, each portion between each of the plurality of data storage patterns and the gate electrode.

According to some example embodiments, a semiconductor device includes a vertical pattern extending in a first direction, interlayer insulating layers, spaced apart from each other in the first direction, a side surface of each of the interlayer insulating layers facing a side surface of the vertical pattern, a gate electrode between the interlayer insulating layers, a side surface of the gate electrode facing the side surface of the vertical pattern, a dielectric structure between the vertical pattern and the interlayer insulating layers with the gate electrode between the interlayer insulating layers, and a plurality of data storage patterns between the gate electrode and the vertical pattern, the plurality of data storage patterns spaced apart from each other in the first direction. The gate electrode includes a plurality of first gate portions and a second gate portion between the plurality of first gate portions. The plurality of first gate portions face the plurality of data storage patterns. Each of the plurality of first gate portions includes a protrusion protruding further than the second gate portion in a direction of the vertical pattern, or the second gate portion includes a protrusion protruding further than the plurality of first gate portions in a direction of the vertical pattern.

According to some example embodiments, a semiconductor device includes a stack structure on a substrate, and a vertical structure penetrating through the stack structure. The stack structure includes a plurality of interlayer insulating layers and a plurality of gate electrodes, stacked alternately and repeatedly. At least a portion of the vertical structure includes a vertical pattern, a first dielectric layer, a second dielectric layer, and a plurality of data storage patterns. The first dielectric layer is between a side surface of the vertical pattern and the stack structure. The second dielectric layer is between the side surface of the vertical pattern and the first dielectric layer. The plurality of data storage patterns are between the first dielectric layer and the second dielectric layer. Each of the plurality of data storage patterns has a first side surface and a second side surface, opposing each other. The first dielectric layer covers the first side surface, an upper surface, and a lower surface of each of the plurality of data storage patterns.

BRIEF DESCRIPTION OF DRAWINGS

The above and other aspects, features, and advantages of the present disclosure will be more clearly understood from the following detailed description, taken in conjunction with the accompanying drawings, in which:

FIG. 1 is a plan view of a semiconductor device according to example embodiments;

FIGS. 2A and 2B are cross-sectional views of a semiconductor device according to some example embodiments;

DETAILED DESCRIPTION

Hereinafter, a semiconductor device according to example embodiment and a method of fabricating the same will be disclosed with reference to the accompanying drawings.

It will be understood that an element that is "on" another element may be above or below the other element. It will be further understood that an element that is "on" another element may be "directly" on the other element, such that the elements are in direct contact with each other, or may be "indirectly" on the other element, such that the elements are isolated from direct contact with each other by one or more interposing spaces and/or structures.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Figure 2A:
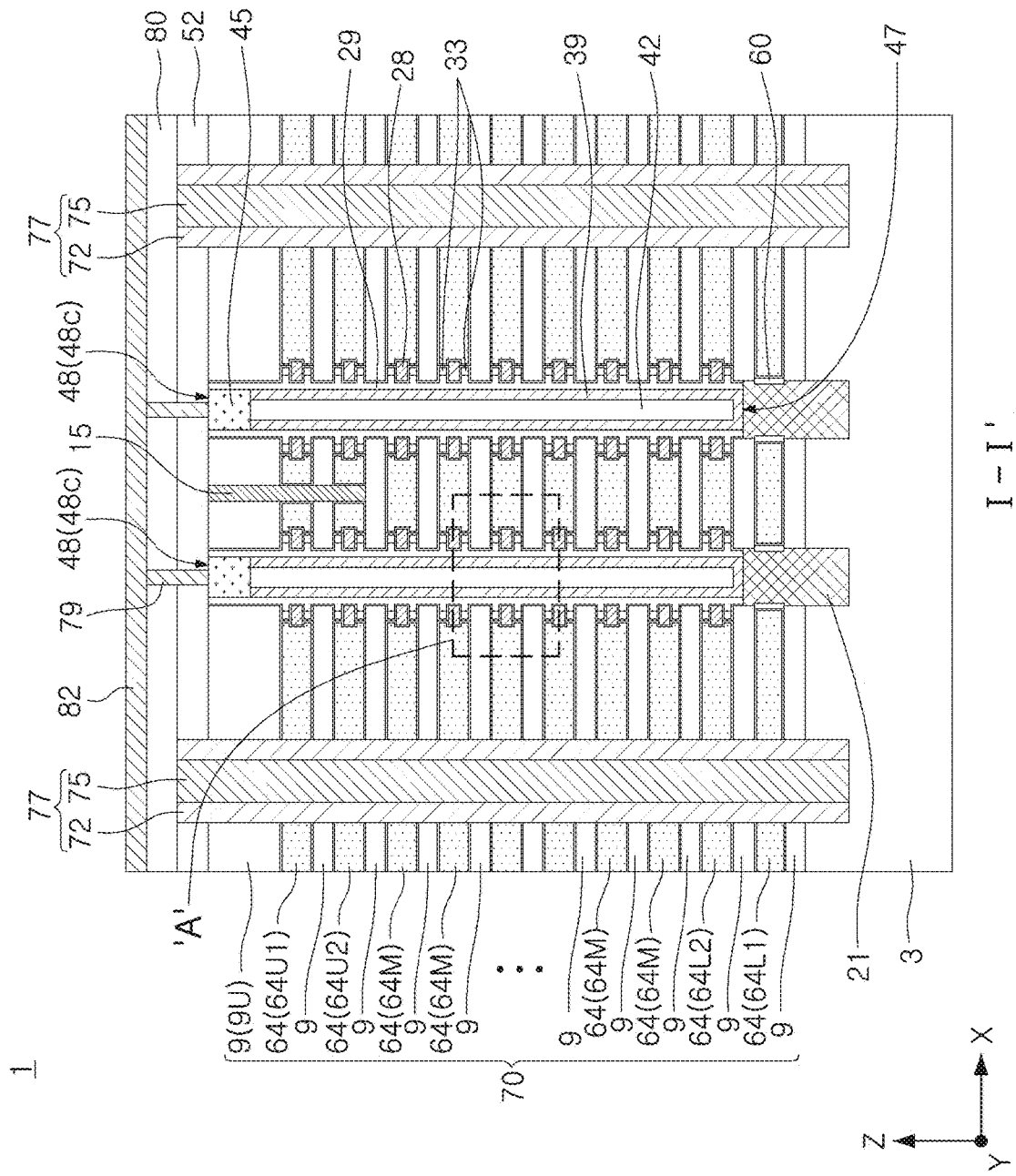
Figure 3:
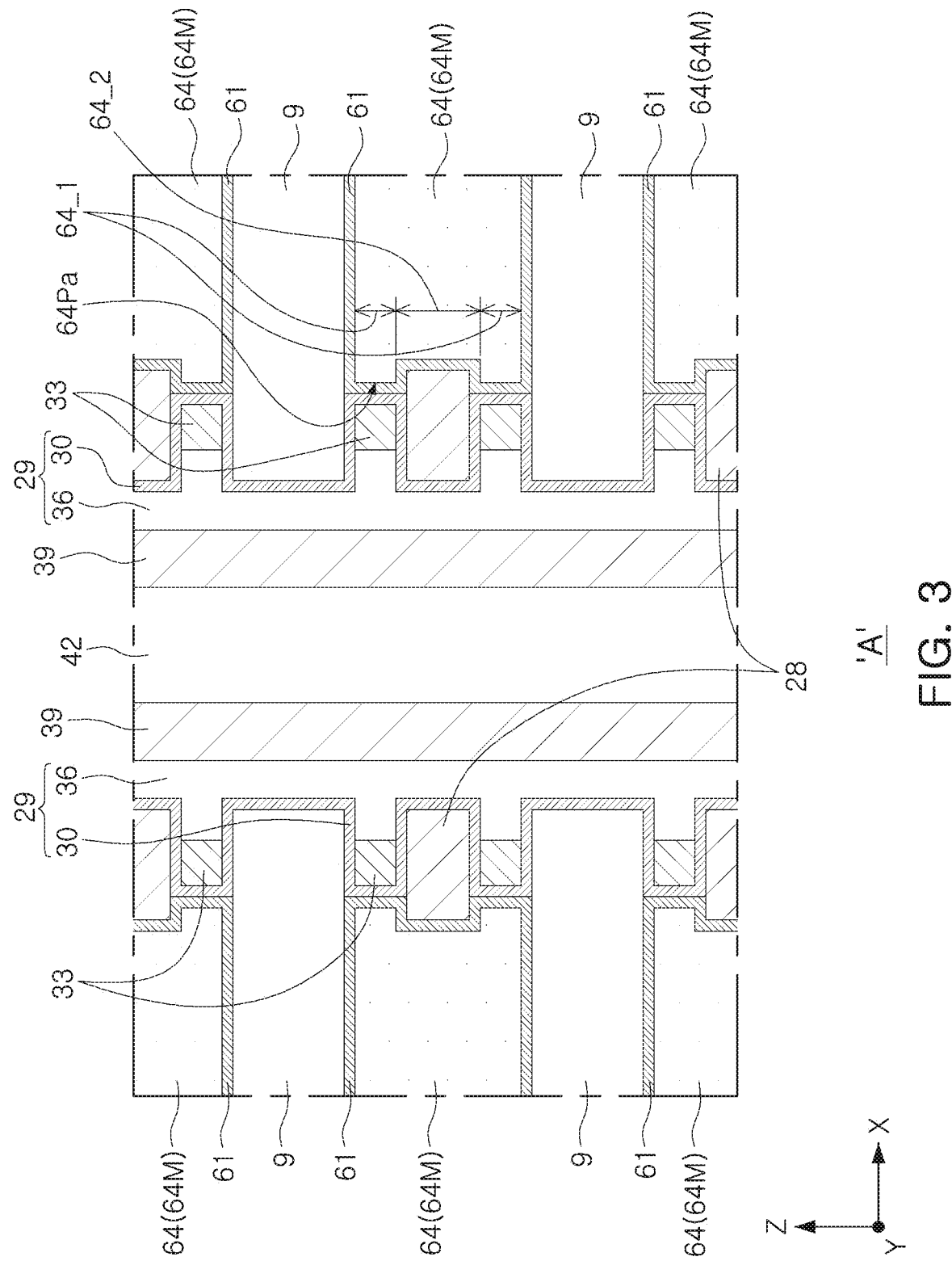
FIG. 3 is a partially enlarged view of a portion of FIG. 2A.

First, a semiconductor device according to some example embodiments will be described with reference to FIGS. 1, 2A, 2B, and 3. FIG. 1 is a plan view illustrating a semiconductor device according to some example embodiments, FIG. 2A is a cross-sectional view, taken along line I-I' of FIG. 1, illustrating a semiconductor device according to some example embodiments, FIG. 2B is a cross-sectional view along line II-II' and III-III' of FIG. 1, and FIG. 3 is a partially enlarged view of portion 'A' of FIG. 2A.

Referring to FIGS. 1, 2A, 2B and 3, a semiconductor device 1 according to some example embodiments may include a substrate 3, a stack structure 70 on the substrate 3, and a plurality of vertical structures 48 penetrating through the stack structure 70.

In some example embodiments, the substrate 3 may be a semiconductor substrate.

In some example embodiments, the stack structure 70 may include a plurality of interlayer insulating layers 9 and a plurality of gate electrodes 64, stacked alternately and repeatedly. The interlayer insulating layers 9 may be formed of an insulating material such as a silicon oxide. The plurality of gate electrodes 64 may include at least one of doped polysilicon, a metal nitride (for example, TiN, WN, and/or the like), and/or a metal (for example, W).

In some example embodiments, the plurality of gate electrodes 64 may include a single or a plurality of lower gate electrodes 64L1 and 64L2, a plurality of middle gate electrodes 64M on the single or plurality of lower gate electrodes 64L1 and 64L2, and a single or a plurality of upper gate electrodes 64U1 and 64U2 on the plurality of middle gate electrodes 64M. When the semiconductor device 1 is a memory device such as a NAND flash memory or the like, the middle gate electrodes 64M may be word-lines. The plurality of middle gate electrodes 64M may be referred to as "cell gate electrode" or "word lines." Among the single or plurality of lower gate electrodes 64L1 and 64L2 and the single or plurality of upper gate electrodes 64U1 and 64U2, at least one gate electrode may be a gate electrode used in operation of a memory device such as a NAND flash memory or the like. For example, at least one of the single or plurality of lower gate electrodes 64L1 and 64L2 may be a ground select gate electrode, and at least one of the single or plurality of upper gate electrodes 64U1 or 64U2 may be a string select gate electrode.

Each of the vertical structures 48 may include a lower vertical region 21 and an upper vertical region 47 on the lower vertical region 21.

In some example embodiments, the lower vertical region 21 may be a semiconductor pattern. For example, the lower vertical region 21 may be a semiconductor pattern formed of an epitaxial semiconductor material. Accordingly, the lower vertical region 21 may be referred to as a "semiconductor pattern", a "lower semiconductor pattern", or the like. At least a portion of the lower vertical region 21 may overlap a lowermost gate electrode 64L1 among the plurality of gate electrodes 64, in a horizontal direction. The lower vertical region 21 may be disposed below the plurality of middle gate electrodes 64M.

The semiconductor device 1 may further include a silicon oxide layer 60 disposed between the lower vertical region 21 and a gate electrode adjacent to the lower vertical region 21, for example, the lowermost gate electrode 64L1.

In some example embodiments, at least a portion of the vertical structure 48 may include a dielectric structure 29, a plurality of data storage patterns 33, a vertical pattern 39, a core pattern 42, and a pad pattern 45. For example, the upper vertical region 47 of the vertical structure 48 may include the dielectric structure 29, the plurality of data storage patterns 33, the vertical pattern 39, the core pattern 42, and the pad pattern 45.

The core pattern 42 may be disposed on the lower vertical region 21 and may extend in a vertical direction Z perpendicular to an upper surface of the substrate 3. The vertical pattern 39 may be in contact with the lower vertical region 21 and may extend in the vertical direction Z perpendicular to the upper surface of the substrate 3. The vertical pattern 39 may be interposed between the core pattern 42 and the lower vertical region 21 and may extend in the vertical direction Z along a side surface of the core pattern 42. The core pattern 42 may be formed of an insulating material such as a silicon oxide. The vertical pattern 39 may include a semiconductor layer. When the semiconductor device 1 is a memory device such as a NAND flash memory or the like, the vertical pattern 39 may be a vertical semiconductor pattern. For example, the vertical pattern 39 may be formed of a semiconductor material such as silicon and/or the like.

The pad pattern 45 may be disposed at a level higher than at least one upper gate layer among the single or plurality of upper gate electrodes 64U1 and 64U2. The pad pattern 45 may be formed of doped polysilicon, for example, N-type polysilicon. The pad pattern 45 may be in contact with the vertical pattern 39.

The dielectric structure 29 may be disposed between an external side surface of the vertical pattern 39 and the stack structure 70.

The plurality of data storage patterns 33 may be disposed between the vertical pattern 39 and the plurality of gate electrodes 64 adjacent to the vertical pattern 39. The plurality of data storage patterns 33 may be formed of a material capable of storing data. For example, when the semiconductor device 1 is a memory device such as a NAND flash memory or the like, the plurality of data storage patterns 33 may be formed of a material capable of trapping charges, for example, a silicon nitride. However, example embodiments are not limited thereto, and the plurality of data storage patterns 33 may be formed of another material which may replace the silicon nitride, for example, polysilicon.

In example embodiments, the plurality of data storage patterns 33, capable of storing information, may be disposed between any one of the middle gate electrode 64M, which may be a word line, and the vertical pattern 39, which may be a channel layer. Accordingly, in the semiconductor device 1 according to example embodiments, each of the plurality of data storage patterns 33 may be used to store data of a memory device such as a NAND flash memory or the like, and thus, memory capacity may be increased without increasing the number of word lines.

In some example embodiments, the semiconductor device 1 may further include middle patterns 28 disposed between the upper vertical region 47 and the plurality of gate electrodes 64. In some example embodiments, the middle patterns 28 may be formed of an insulating material, for example, a silicon oxide.

In some example embodiments, the semiconductor device 1 may further include a third dielectric layer (61 of FIG. 3), interposed between the plurality of gate electrodes 64 and the plurality of interlayer insulating layers 9, extending between the plurality of gate electrodes 64 and the vertical structures 48. The third dielectric layer (61 of FIG. 3) may be formed of a high-k dielectric such as an aluminum oxide.

In some example embodiments, the semiconductor device 1 may further include an insulating pattern 15 penetrating through the single or the plurality of upper gate electrodes 64U1 and 64U2. For example, the insulating pattern 15 may penetrate through an uppermost interlayer insulating layer 9U and may extend downwardly to penetrate through the single or plurality of upper gate electrodes 64U1 and 64U2. The insulating pattern 15 may be formed of a silicon oxide. The insulating pattern 15 may be disposed at a level higher than a level of the plurality of middle gate electrodes 64M.

In some example embodiments, the plurality of vertical structures 48 may include vertical cell structures 48c and vertical dummy structures 48d. The vertical dummy structures 48d may penetrate through the insulating pattern 15 to extend downwardly, and the vertical cell structures 48c may be spaced apart from the insulating pattern 15. The vertical cell structures 48c and the vertical dummy structures 48d may have substantially the same cross-sectional structure.

In some example embodiments, the semiconductor device 1 may further include a first capping insulating layer 52 and a second capping insulating layer 80, sequentially stacked on the stack structure 70, and separation structures 77, spaced apart from the vertical structures 48, penetrating through the stack structure 70. Each of the separation structures 77 may include a separation pattern 75 and a separation spacer 72 between a sidewall of the separation pattern 75 and the stack structure 70. In some example embodiments, the separation spacer 72 may be formed of an insulating material (for example, a silicon oxide, etc.), and the separation pattern 75 may be formed of a conductive material (for example, doped polysilicon, tungsten, and/or the like). In some example embodiments, the separation spacer 72 and the separation pattern 75 may be formed of an insulating material (for example, a silicon oxide, and/or the like).

In some example embodiments, the semiconductor device 1 may further include bit line contact plugs 79, penetrating through the first and second capping insulating layers 52 and 80 to be electrically connected to the pad patterns 45 of the vertical cell structures 48c, and a bit line 82 on the bit line contact plugs 79.

Hereinafter, an example of the dielectric structure 29 and the plurality of data storage patterns 33 will be described with reference to FIG. 3. The description will focus on a middle gate electrode 64M, disposed between the interlayer insulating layers 9 adjacent to each other in the vertical direction Z, among the plurality of middle gate electrodes 64M. In the description below, the middle gate electrode 64M will be replaced with any one lower gate electrode 64L2, among the single or plurality of lower gate electrodes 64L1 and 64L2, and any one upper gate electrode 64U1 or 64U2 among the single or plurality of upper gate electrodes 64U1 and 64U2.

Referring to FIG. 3, the vertical pattern 39 may extend in a first direction, for example, the vertical direction Z. Any one middle gate electrode 64M may be disposed between the interlayer insulating layers 9, adjacent to each other and spaced apart from each other, in the vertical direction Z. The interlayer insulating layers 9 and the middle gate electrode 64M may face a side surface of the vertical pattern 39.

A plurality of data storage patterns 33 may be disposed between the vertical pattern 39 and the middle gate electrode 64M. The plurality of data storage patterns 33 may be disposed between the interlayer insulating layers 9. The plurality of data storage patterns 33 may be spaced apart from each other in the vertical direction Z. A pair of data storage patterns 33 may be disposed between the interlayer insulating layers 9 adjacent to each other in the vertical direction Z.

The middle pattern 28 may be disposed between the interlayer insulating layers 9 adjacent to each other in the vertical direction Z. The plurality of data storage patterns 33 may be disposed between the middle pattern 28 and the interlayer insulating layers 9.

In some example embodiments, a thickness of the middle pattern 28 may be substantially the same as a distance between the middle pattern 28 and the interlayer insulating layers 9.

The dielectric structure 29 may be disposed between the vertical pattern 39 and the middle gate electrode 64M and may extend between the vertical pattern 39 and the interlayer insulating layers 9. The middle pattern 28 may be disposed between the dielectric structure 29 and the middle gate electrode 64M.

The dielectric structure 29 may include a first dielectric layer 30 and a second dielectric layer 36. The second dielectric layer 36 may be disposed between the first dielectric layer 30 and the vertical pattern 39. The plurality of data storage patterns 33 may be disposed between the first dielectric layer 30 and the second dielectric layer 36.

The first dielectric layer 30 may include a portion, disposed between each of the plurality of data storage patterns 33 and the middle gate electrode 64M, extending between the plurality of data storage patterns 33. The first dielectric layer 30 may extend to upper surfaces and lower surfaces of the plurality of data storage patterns 33 from a portion interposed between each of the plurality of data storage patterns 33 and the middle gate electrode 64M.

The first dielectric layer 30 may extend from a portion, covering an upper surface and a lower surface of each of the plurality of data storage patterns 33, in a direction away from side surfaces of the middle gate electrode 64M facing each of the plurality of data storage patterns 33. The first dielectric layer 30 may extend from the portion, covering the upper surface and the lower surface of each of the plurality of data storage patterns 33, between the interlayer insulating layers 9 and the second dielectric layer 36.

The middle pattern 28 may be disposed between the plurality of data storage patterns 33. A horizontal width of the middle pattern 28 may be greater than a horizontal width of each of the plurality of data storage patterns 33. The first dielectric layer 30 may extend from a portion, disposed between the middle gate electrode 64M and each of the plurality of data storage patterns 33, between the plurality of data storage patterns 33 and the interlayer insulating layers 9 and between the second dielectric layer 36 and the interlayer insulating layers 9. The first dielectric layer 30 may extend from the portion, disposed between the middle gate electrode 64M and each of the plurality of data storage patterns 33, between the plurality of data storage patterns 33 and the middle pattern 28 and between the second dielectric layer 36 and the middle pattern 28.

The third dielectric layer 61 may cover a side surface of the middle gate electrode 64M, facing the vertical pattern 39, and may extend between the middle gate electrode 64M and the interlayer insulating layers 9. The third dielectric layer 61 may be interposed between the middle gate electrode 64M and the middle pattern 28 and may extend from a portion, interposed between the middle gate electrode 64M and the middle pattern 28, between the first dielectric layer 30 and the middle gate electrode 64M.

The middle gate electrode 64M may include first gate portions 64_1, adjacent to the interlayer insulating layers 9, and a second gate portion 64_2 between the first gate portions 64_1. The first gate portions 64_1 may face the plurality of data storage patterns 33. The second gate portion 64_2 may face the middle pattern 28.

Each of the first gate portions 64_1 may include a gate protrusion 64Pa protruding further than the vertical pattern 39 than the second gate portion 64_2 in a direction of the vertical pattern 39. Accordingly, the middle gate electrode 64M may include gate protrusions 64Pa facing the plurality of data storage patterns 33. A portion of the middle pattern 28 may be disposed between the gate protrusions 64Pa of the first gate portions 64_1.

In some example embodiments, each of the first gate portions 64_1 may have a thickness smaller than a thickness of the second gate portion 64_2.

Next, various some example embodiments of the semiconductor device according to some example embodiments will be described with reference to FIGS. 4A, 4B, 4C, 4D, 4E, 4F, and 4G, respectively. FIGS. 4A, 4B, 4C, 4D, 4E, 4F, and 4G are partially enlarged views corresponding to the partially enlarged view of FIG. 3.

Figure 4A:
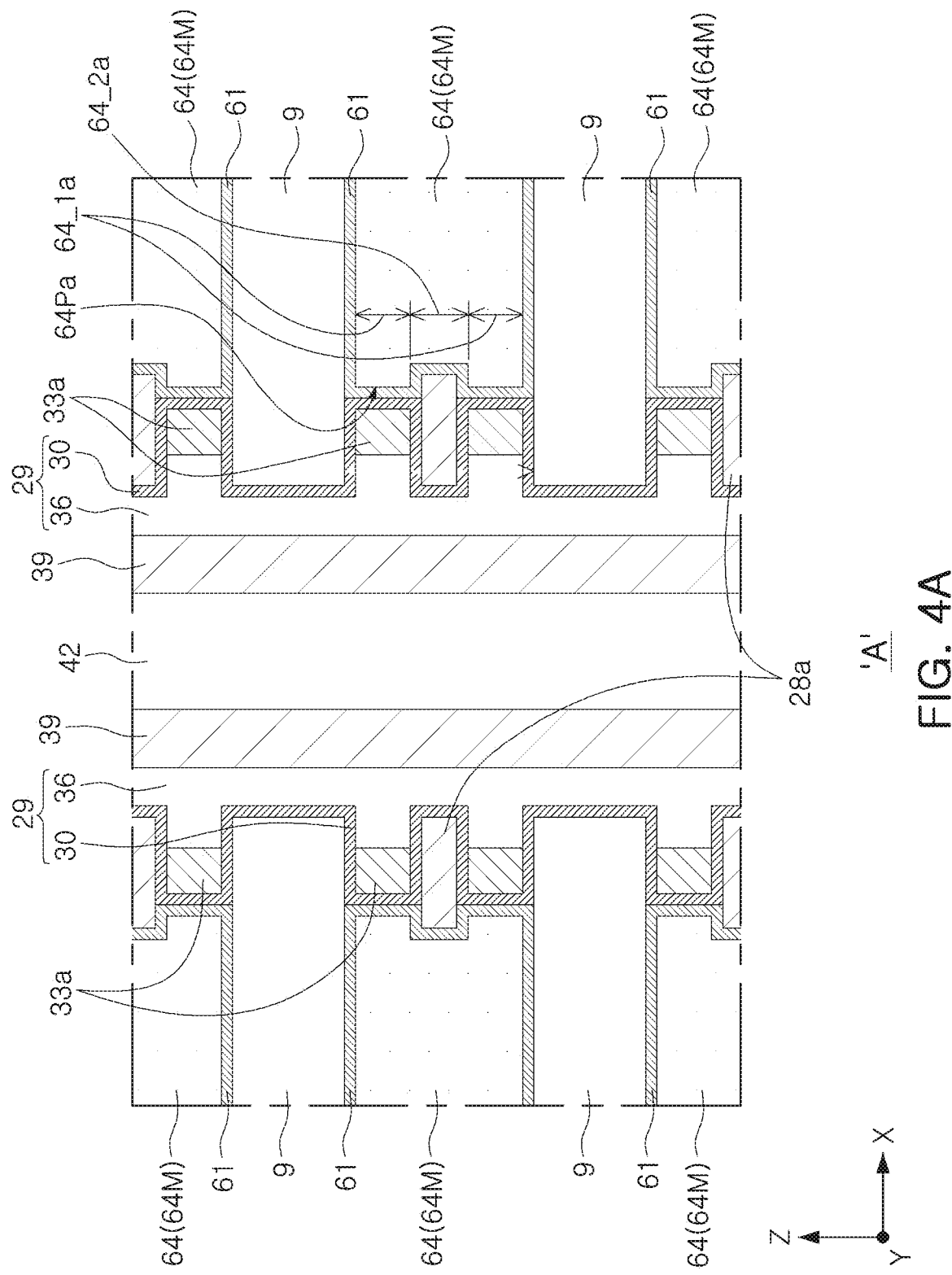
FIG. 4A is a partially enlarged view illustrating some example embodiments of a semiconductor device according to some example embodiments.

In some example embodiments, referring to FIG. 4A, a middle pattern 28a may have a thickness smaller than a distance between the middle pattern 28 and the interlayer insulating layers 9. The middle gate electrode 64M may include first gate portions 64_1a, adjacent to the interlayer insulating layers 9, and a second gate portion 64_2a between the first gate portions 64_1a. The second gate portion 64_2a, facing the middle pattern 28a, may have a thickness smaller than a width of each of the first gate portions 64_1a. Each of the plurality of data storage patterns 33a may have a thickness greater than the thickness of the middle pattern 28a.

Figure 4B:
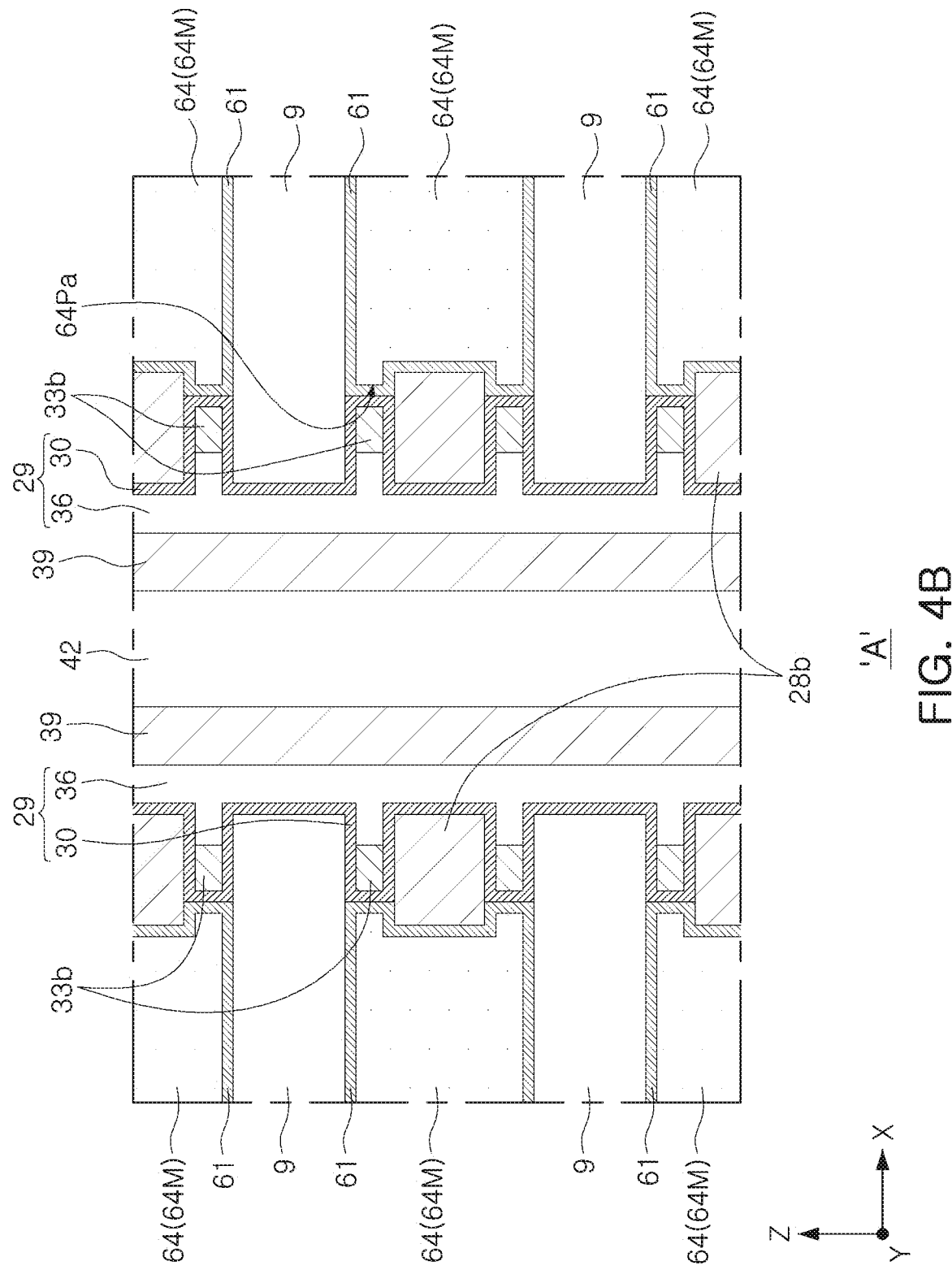
FIG. 4B is a partially enlarged view illustrating some example embodiments of a semiconductor device according to some example embodiments.

In some example embodiments, referring to FIG. 4B, a middle pattern 28b may have a thickness greater than a distance between a middle pattern 28 and interlayer insulating layers 9. Each of the plurality of data storage patterns 33b may have a thickness smaller than the thickness of the middle pattern 28b.

Figure 4C:
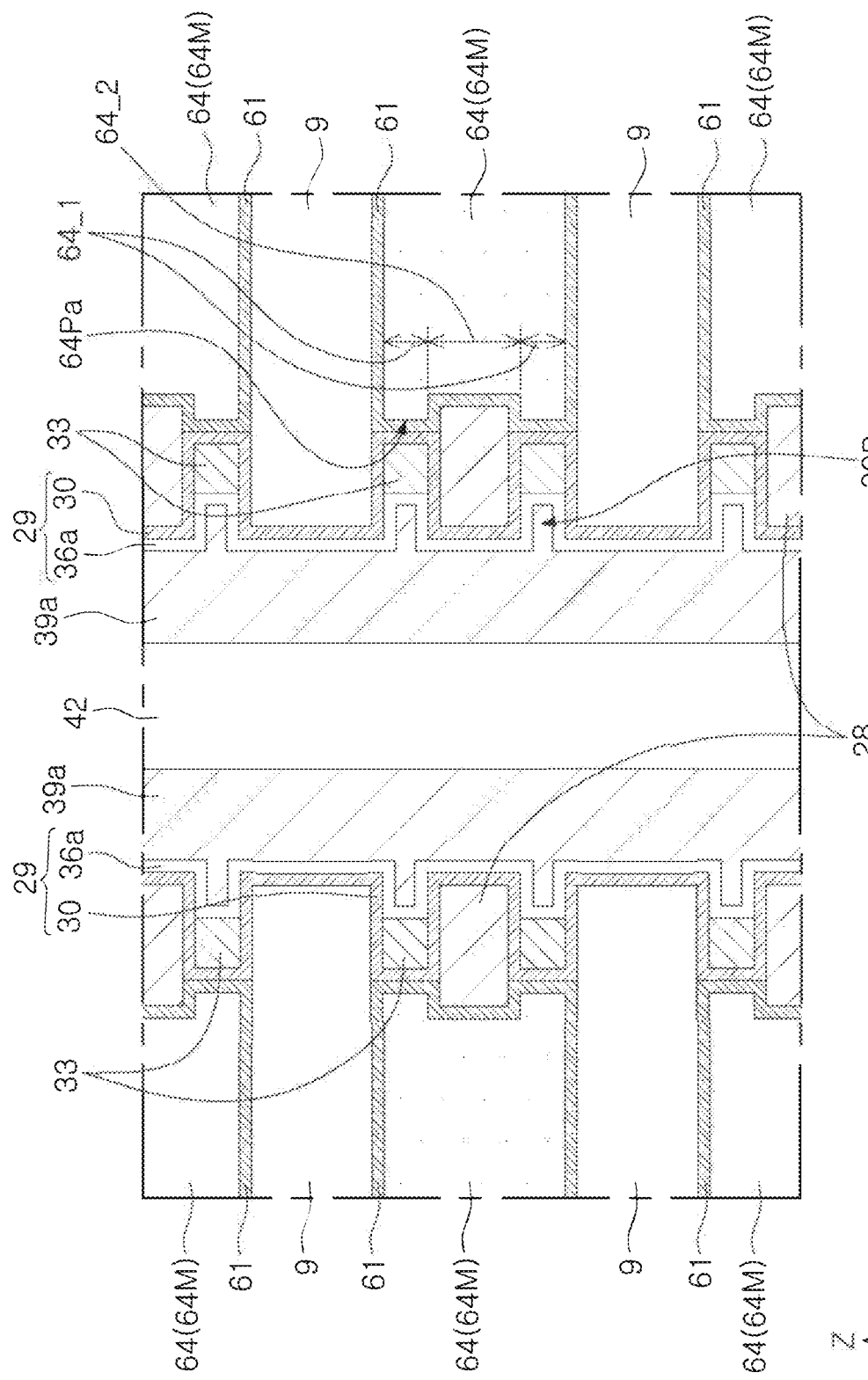
FIG. 4C is a partially enlarged view illustrating some example embodiments of a semiconductor device according to some example embodiments.

In some example embodiments, referring to FIG. 4C, a vertical pattern 39a may further include extending from portions, facing a plurality of data storage patterns 33, between interlayer insulating layers 9 and a middle pattern 28. A second dielectric layer 36a may be interposed between protrusions 39P of the vertical pattern 39a and the and the plurality of data storage patterns 33 and may extend to a top surface and a lower surface of each of the protrusions 39P of the vertical pattern 39a.

Figure 4D:
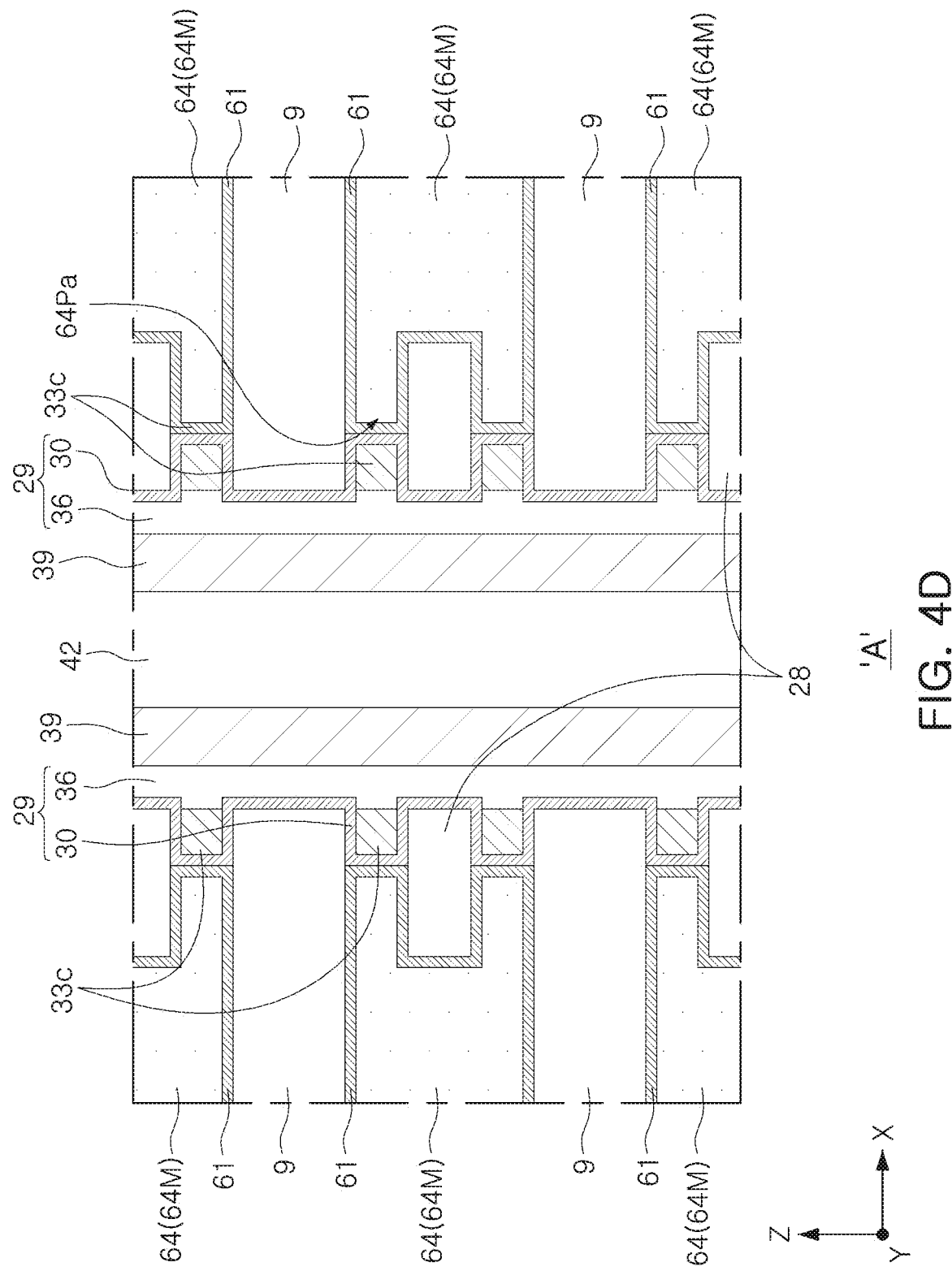
FIG. 4D is a partially enlarged view illustrating some example embodiments of a semiconductor device according to some example embodiments.

In some example embodiments, referring to FIG. 4D, a distance between side surfaces of a plurality of data storage patterns 33c, facing a middle gate electrode 64M, and a middle pattern 28, facing the middle gate electrode 64M, may be greater than a distance between side surfaces of a plurality of data storage patterns 33c, facing a vertical pattern 39, and the middle pattern 28 facing the vertical pattern 39.

Figure 4E:
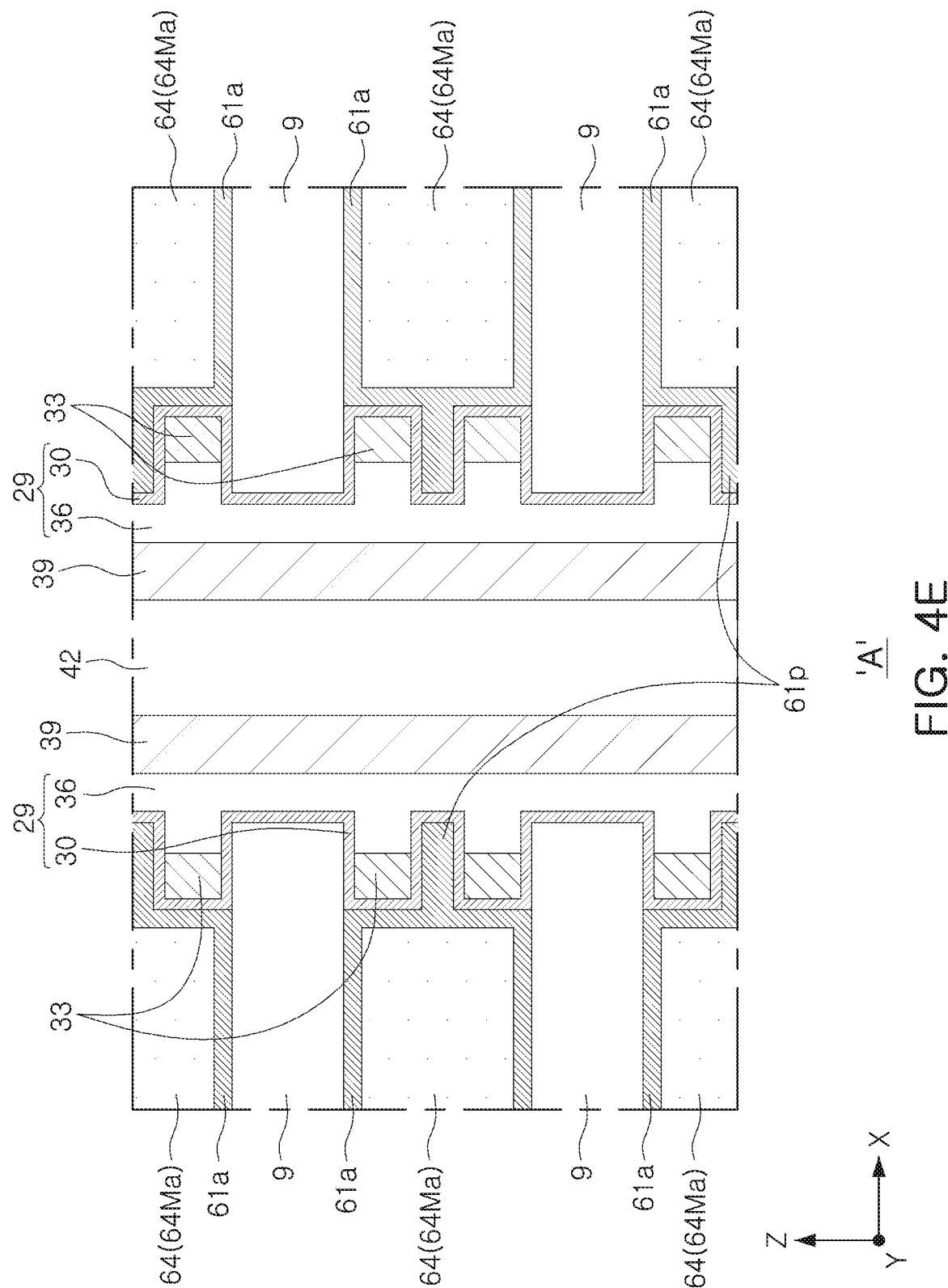
FIG. 4E is a partially enlarged view illustrating some example embodiments of a semiconductor device according to some example embodiments.

In some example embodiments, referring to FIG. 4E, between interlayer insulating layers 9 adjacent to each other in a vertical direction, a third dielectric layer 61a may be disposed between the interlayer insulating layers 9 and a middle gate electrode 64Ma, may cover a side surface of the middle gate electrode 64Ma, facing the vertical pattern 39, and may include a dielectric protrusion 61P extending from a portion, covering the side surface of the middle gate electrode 64Ma, between the plurality of data storage patterns 33.

The dielectric protrusion 61P of the third dielectric layer 61a may protrude in a direction from a portion, interposed between the plurality of data storage patterns 33, to the vertical pattern 39.

A portion of the first dielectric layer 30 may be interposed between the plurality of data storage patterns 33 and the dielectric protrusion 61P, and may be interposed between the second dielectric layer 36 and a portion protruding in a direction from a portion, interposed between the plurality of data storage patterns 33 of the dielectric protrusion 61P, to the vertical pattern 39.

Figure 4F:
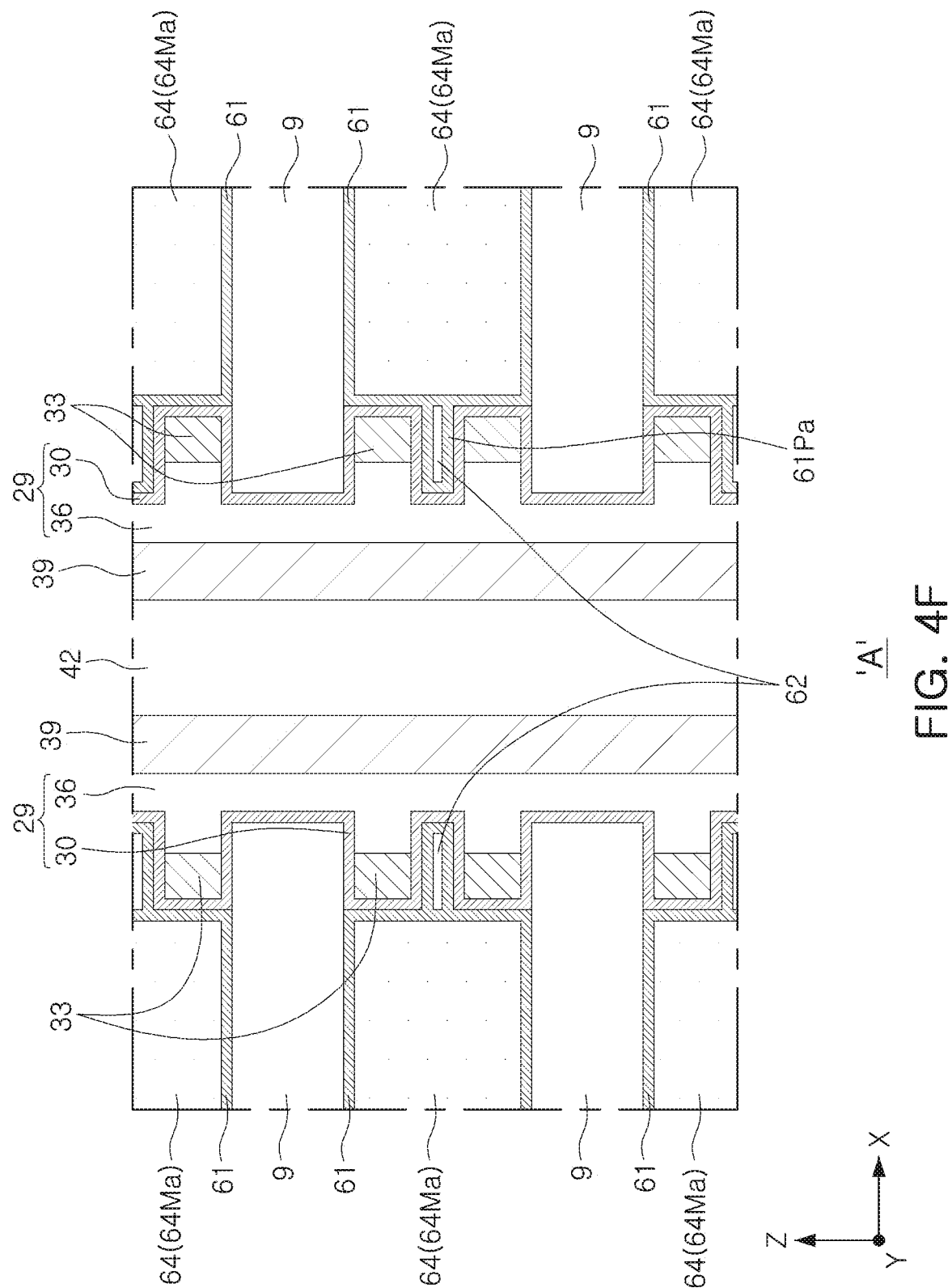
FIG. 4F is a partially enlarged view illustrating some example embodiments of a semiconductor device according to some example embodiments.

In some example embodiments, referring to FIG. 4F, between interlayer insulating layers 9 adjacent to each other in a vertical direction, a third dielectric layer 61a may be interposed between the interlayer insulating layers 9 and middle gate electrode 64Ma, may cover a side surface of the middle gate electrode 64Ma facing a vertical pattern 39, and may include a dielectric protrusion 61Pa extending from a portion, covering the side surface of the middle gate electrode 64Ma, between the plurality of data storage patterns 33.

An air gap 62 may be disposed in the dielectric protrusion 61Pa. The air gap 62 may be defined by the dielectric 61 contouring the gate dielectric 64 and first dielectric layer 30. At least a portion of the air gap 62 may be disposed between the plurality of data storage patterns 33. The air gap 62 may be a void.

Figure 4G:
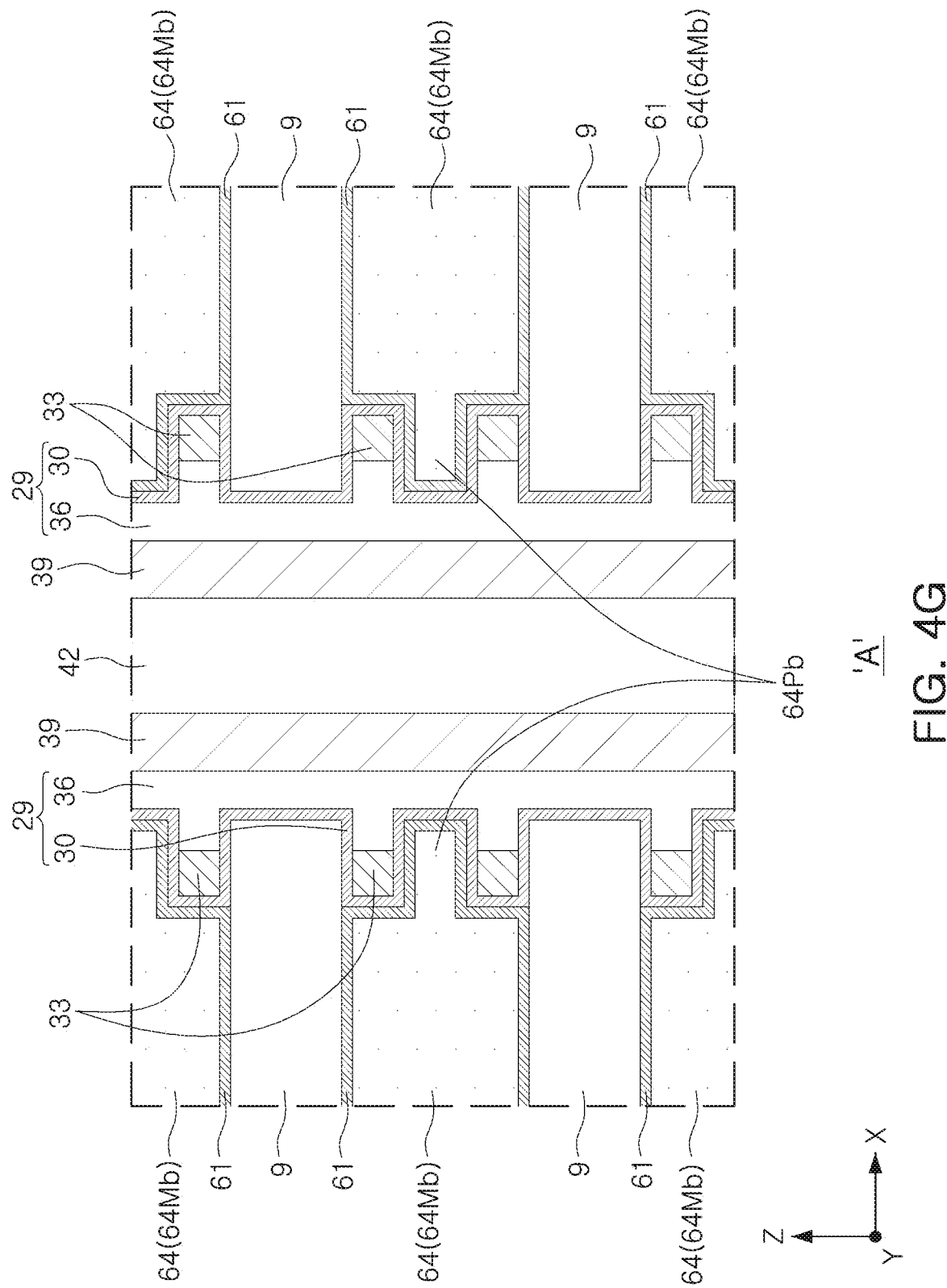
FIG. 4G is a partially enlarged view illustrating some example embodiments of a semiconductor device according to some example embodiments.

In some example embodiments, referring to FIG. 4G, between interlayer insulating layers 9 adjacent to each other in the vertical direction, a middle gate electrode 64MB may include first gate portions 64_1b, adjacent to the interlayer insulating layers 9, and a second gate portion 64_2b between the first gate portions 64_1b. The first gate portion 64_1b may face a plurality of data storage patterns 33.

The second gate portion 64_2 may include a gate protrusion 64Pb protruding further than the first gate portions 64_1b in a direction of the vertical pattern 39. At least a portion of the gate protrusion 64P of the second gate portion 64_2 of the middle gate electrode 64M may be disposed between the plurality of data storage patterns 33.

In one example, the gate protrusion 64P of the second gate portion 64_2 may extend in a direction from the portion, interposed between the plurality of data storage patterns 33, to the vertical pattern 39.

Next, some example embodiments of a semiconductor device according to some example embodiments will be described with reference to FIGS. 5, 6, 7, and 8. FIGS. 5, 6, 7 and 8 are cross-sectional views illustrating some example embodiments of the semiconductor device according to example embodiments. In the description of modified components of the some example embodiments of the semiconductor device with reference to FIGS. 5, 6, 7, and 8, descriptions of the same components will be omitted and only modified components will be described.

Figure 5:
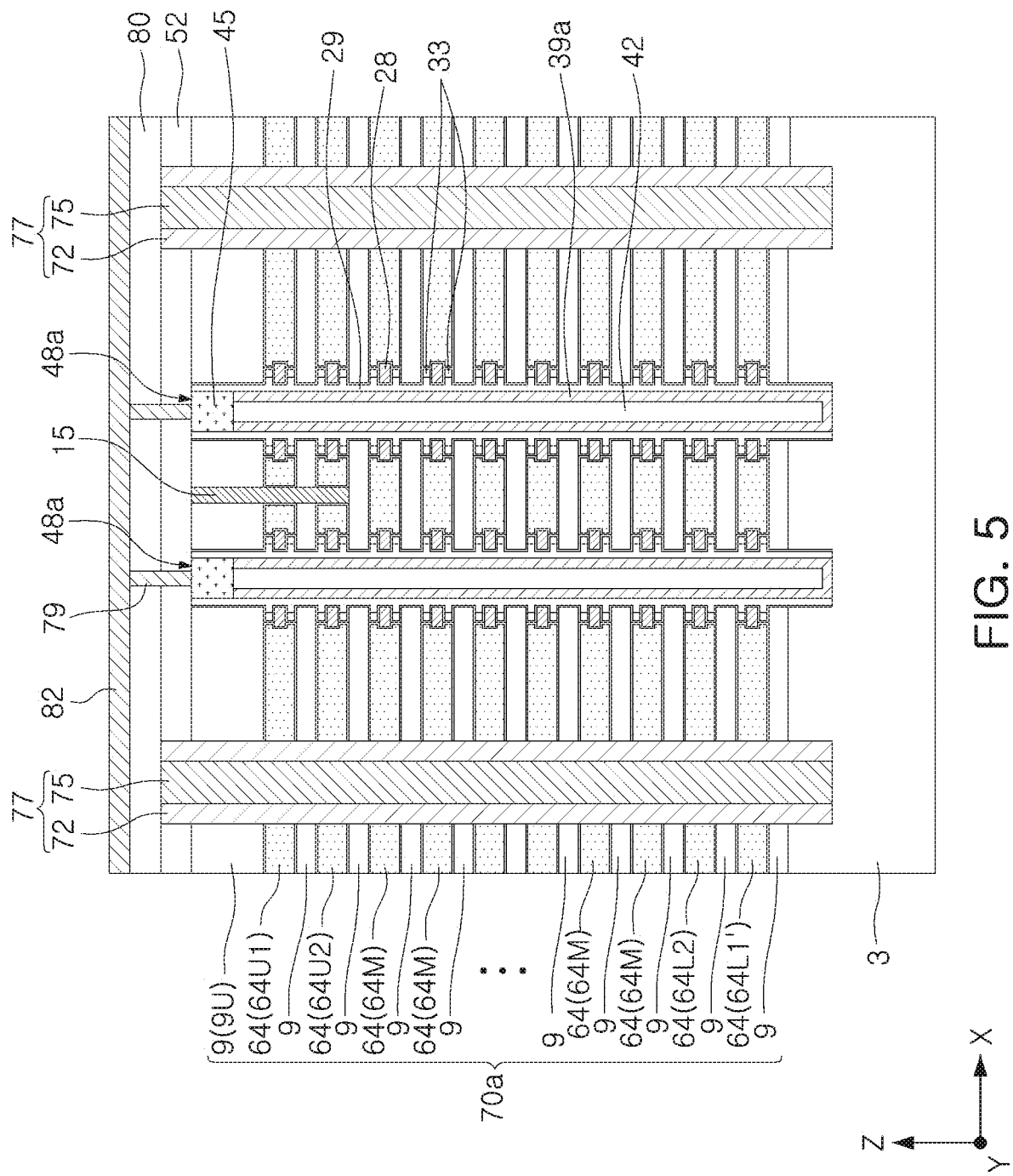
FIG. 5 is a cross-sectional view illustrating some example embodiments of a semiconductor device according to some example embodiments.

In the some example embodiments, referring to FIG. 5, a stack structure 70a may be disposed on a substrate 3. The stack structure 70a may include a plurality of interlayer insulating layers 9 and a plurality of gate electrodes 64, stacked alternately and repeatedly.

In some example embodiments, the plurality of gate electrodes 64 is a single or a plurality of lower gate electrodes 64L1' and 64L2, and a plurality of middle gate electrodes 64M on the plurality of lower gate electrodes 64L1' and 64L2, and a single or plurality of upper gate electrodes 64U1 and 64U2 on the plurality of middle gate electrodes 64M.

A vertical structure 48a may extend in a vertical direction Z, perpendicular to an upper surface of the substrate 3, to penetrate through the stack structure 70a. The vertical structure 48a may have a shape in which the above-described lower vertical region (21 of FIGS. 2A and 2B) is omitted and the above-described upper vertical region (47 of FIGS. 2A and 2B) penetrates through the stack structure 70a. Accordingly, the vertical structure 48a may have a cross-sectional structure similar to a cross-sectional structure of the upper vertical region (47 of FIGS. 2A and 2B) of the above-described vertical structure (48 of FIGS. 2A and 2B). As the lower vertical region (21 in FIGS. 2A and 2B) is omitted, a cross-sectional shape of a lowermost lower gate electrode 64L1', facing the vertical structure 48a, may be substantially the same as a cross-sectional shape of each of the gate electrodes 64L2, 64M, 64U1, and 64U2. Therefore, similarly to the above-described upper vertical region (47 of FIGS. 2A and 2B), the vertical structure 48a may include a dielectric structure 29, a plurality of data storage patterns 33, a vertical pattern 39a, a core pattern 42, and a pad pattern 45. The vertical pattern 39a may penetrate through the stack structure 70a and may be in contact with the substrate 3.

Figure 6:
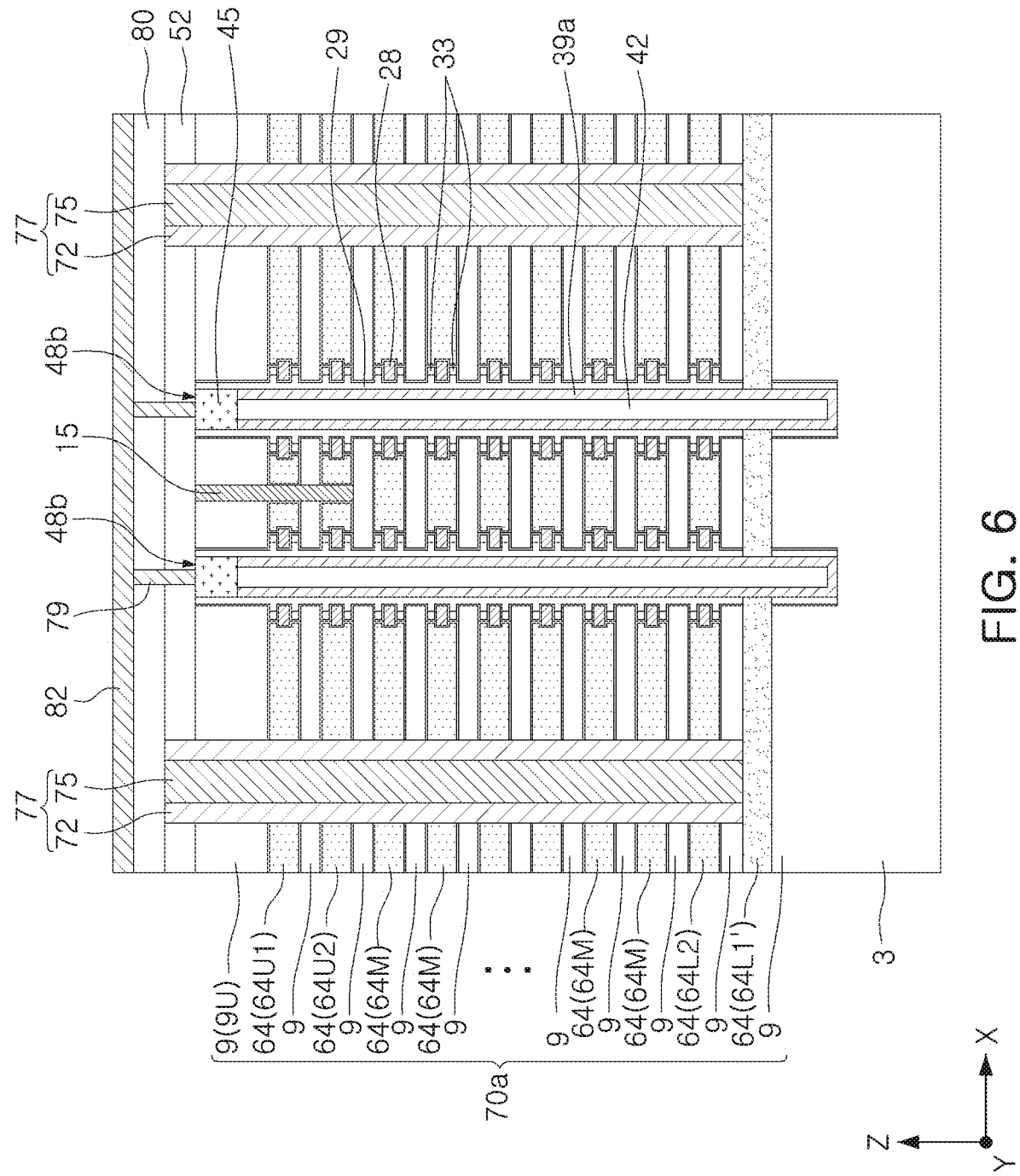
FIG. 6 is a cross-sectional view illustrating some example embodiments of a semiconductor device according to some example embodiments.

In some example embodiments, referring to FIG. 6, a horizontal connection pattern 90 may be disposed between the stack structure 70a and the substrate 3 described with reference to FIG. 5. The horizontal connection pattern 90 may be formed of doped polysilicon, for example, N-type polysilicon.

A vertical structure 48b may sequentially penetrate through the stack structure 70a and the horizontal connection pattern 90 to extend into the substrate 3. Similarly to the vertical structure (48a of FIG. 5), the vertical structure 48b may include a dielectric structure 29, a plurality of data storage patterns 33, a vertical pattern 39a, a core pattern 42, and a pad pattern 45.

The horizontal connection pattern 90 may penetrate through the dielectric structure 29 and may be in contact with the vertical pattern 39a.

In some example embodiments, the horizontal connection pattern 90 may be in contact with the substrate 3.

In some example embodiments, the horizontal connection pattern 90 may extend between a separation structure 77 and the substrate 3.

Figure 7:
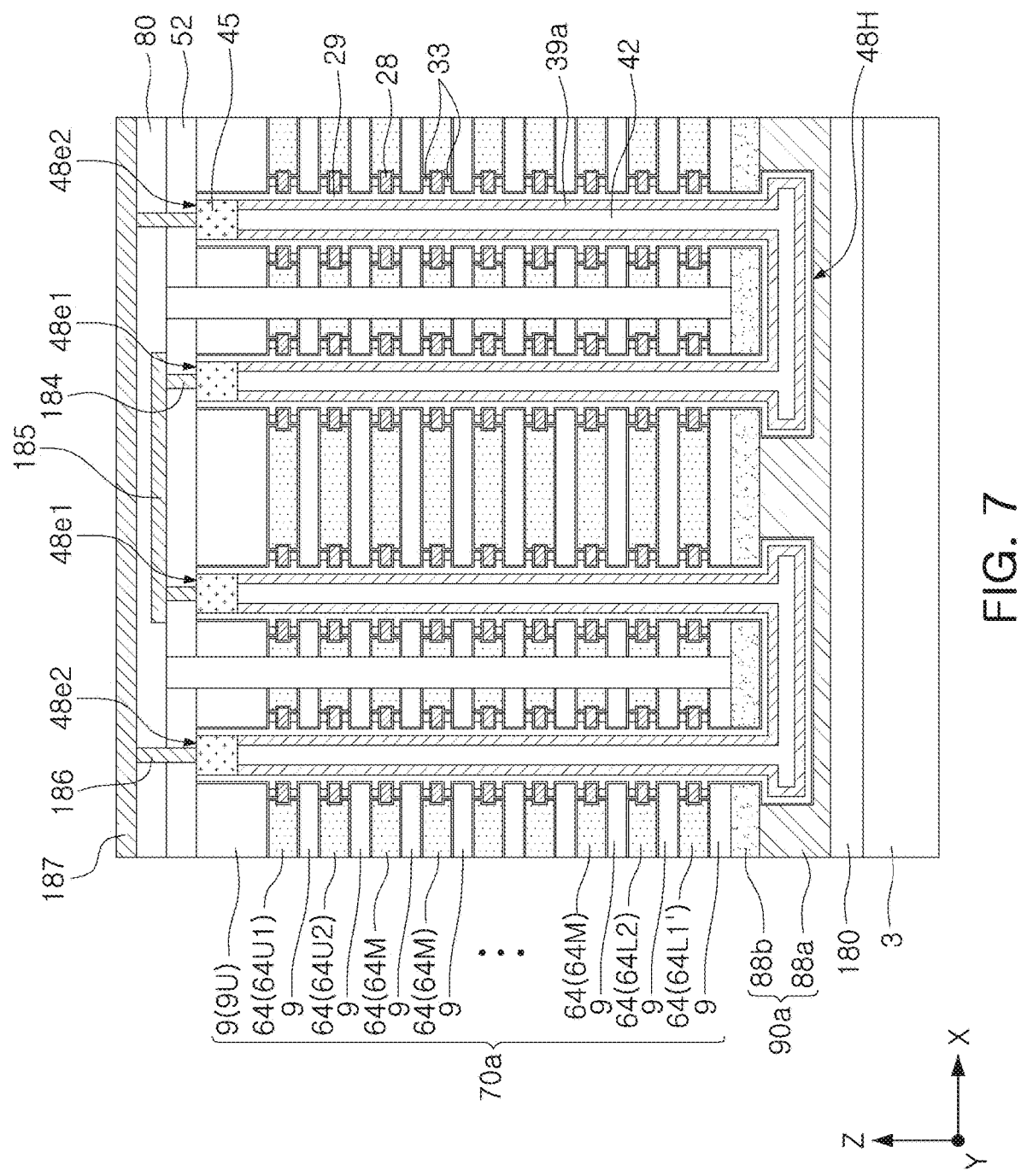
FIG. 7 is a cross-sectional view illustrating some example embodiments of a semiconductor device according to some example embodiments.

In some example embodiments, referring to FIG. 7, a stack structure 70, substantially the same as described in FIG. 5, may be disposed on a substrate 3. A first capping insulating layer 52 and a second capping insulating layer 80 may be sequentially stacked on the stack structure 70a.

A conductive layer 190 may be disposed between the substrate 3 and the stack structure 70a. An insulating layer 180 may be disposed between a conductive layer 190 and the substrate 3. The conductive layer 190 may include a first conductive layer 188a and a second conductive layer 188b on the first conductive layer 188a. The first conductive layer 118a may be a first pipe gate electrode, and the second conductive layer 188b may be a second pipe gate electrode.

A separation structure 170 may be disposed to penetrate through the first capping insulating layer 52. The separation structure 170 may extend downwardly to penetrate from an uppermost gate electrode 64U1 to a lowermost gate electrode 64L' of the stack structure 70a. The separation structure 170 may be formed of an insulating material (for example, a silicon oxide, and/or the like).

Vertical structures may be disposed to penetrate through the stack structure 70a. The vertical structures may include a first vertical structure 48e1 and a second vertical structure 48e2 disposed on opposite sides of the separation structure 170.

The first vertical structure 48e1 and the second vertical structure 48e2 may extend downwardly from a portion, penetrating through the stack structure 70a, to penetrate through the second conductive layer 88b. A horizontal connection pattern 48H may be disposed in the first conductive layer 88a. The horizontal connection pattern 48H may connect the first vertical structure 48e1 and the second vertical structure 48e2 to each other.

Portions of the vertical structures 48e1 and 48e2, disposed in the stack structure 70a, may have substantially the same cross-sectional structure as a portion of the vertical structure (48a in FIG. 5) disposed in the stack structure (70a in FIG. 5) described in FIG. 5. Accordingly, similarly to the vertical structure (48a of FIG. 5) described with reference to FIG. 5, the portions of the vertical structures 48e1 and 48e2, disposed in the stack structure 70a, may include a dielectric structure 29, a plurality of data storage patterns 33, a vertical pattern 39a, a core pattern 42, and a pad pattern 45.

The dielectric structure 29, the vertical pattern 39a, and the core pattern 42 may successively extend from the portions of the vertical structures 48e1 and 48e2, disposed in the stack structure 70a, to comprise a horizontal connection pattern 48H.

A common source line 185 may be disposed on a first capping insulating layer 52, and a bitline 187 may be disposed on a second capping insulating layer 80.

A source contact plug 184 may be disposed to electrically connect the common source line 185 and the pad pattern 45 of the first vertical structure 48e1 to each other, and a bitline contact plug 186 may be disposed to electrically connect the bitline 187 and the pad pattern 45 of the second vertical structure 48e2.

Figure 8:
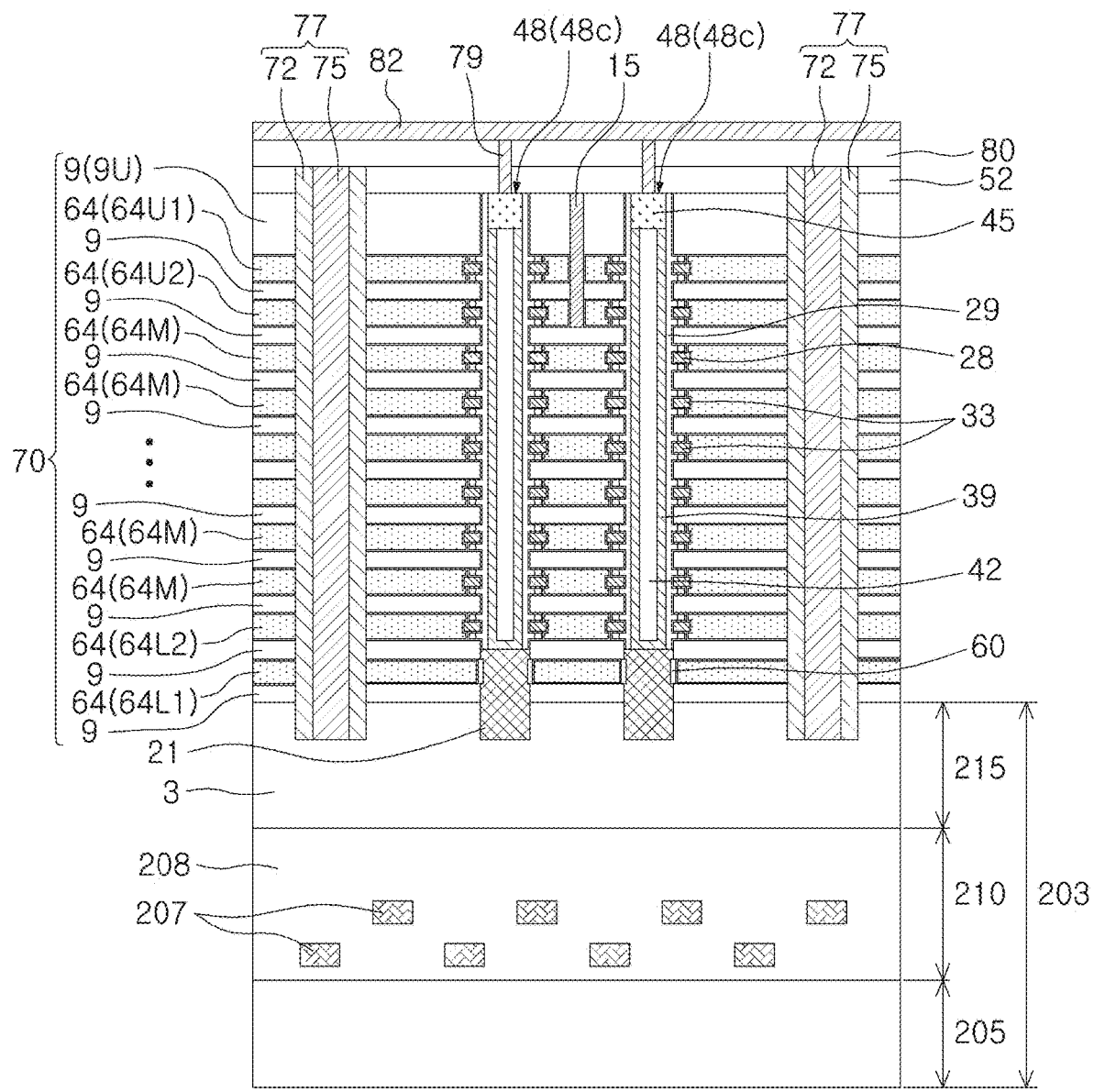
FIG. 8 is a cross-sectional view illustrating some example embodiments of a semiconductor device according to some example embodiments.

In some example embodiments, referring to FIG. 8, a substrate 203 may include a lower substrate 205, an upper substrate 215 on the lower substrate 205, and a peripheral circuit structure 210 between the lower substrate 205 and the upper substrate 215. The lower substrate 205 may be a semiconductor substrate. The upper substrate 215 may be a polysilicon substrate and/or a conductive substrate. The upper substrate 215 may include a conductive layer such as a metal or the like. The peripheral circuit structure 210 may include peripheral interconnections 207, such as peripheral gate interconnections and peripheral metal interconnection, and a peripheral insulating layer 208 covering the peripheral interconnections 207.

Next, an example of a method of fabricating a semiconductor device according to some example embodiments will be described with reference to FIGS. 9A to 15B. In FIGS. 9A to 15B, FIGS. 9A, 10A, 11A, 12A, 13A, 14A, and 15A are cross-sectional views taken along the line I-I' of FIG. 1, and FIGS. 9B and 10B. 11B, 12B, 13B, 14B, and 15B are cross-sectional views taken along lines II-II' and III-III' of FIG. 1.

Figure 9A:
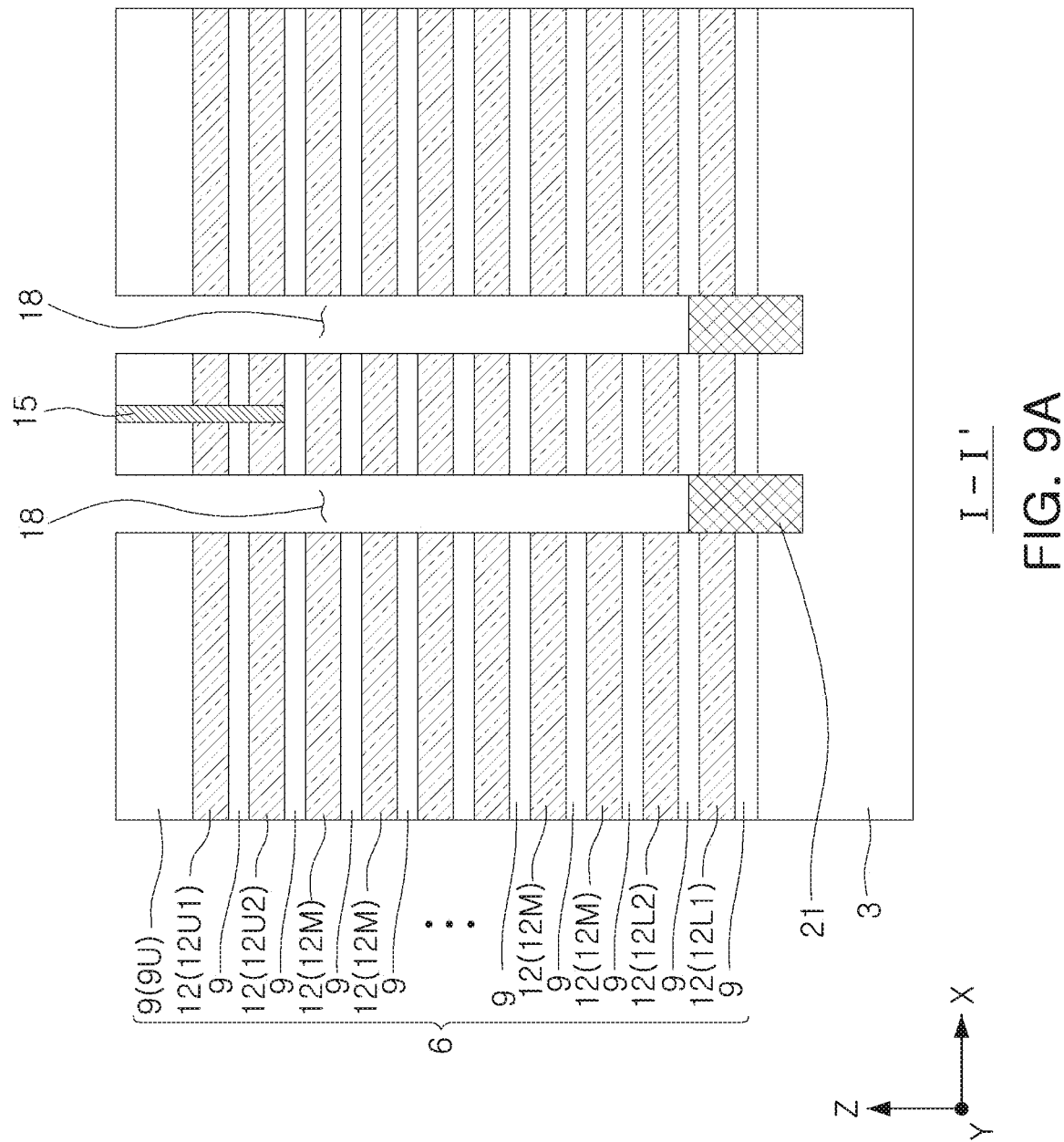
FIGS. 9A to 15B are cross-sectional views illustrating an example of a method of fabricating a semiconductor device according to some example embodiments.
Figure 9B:
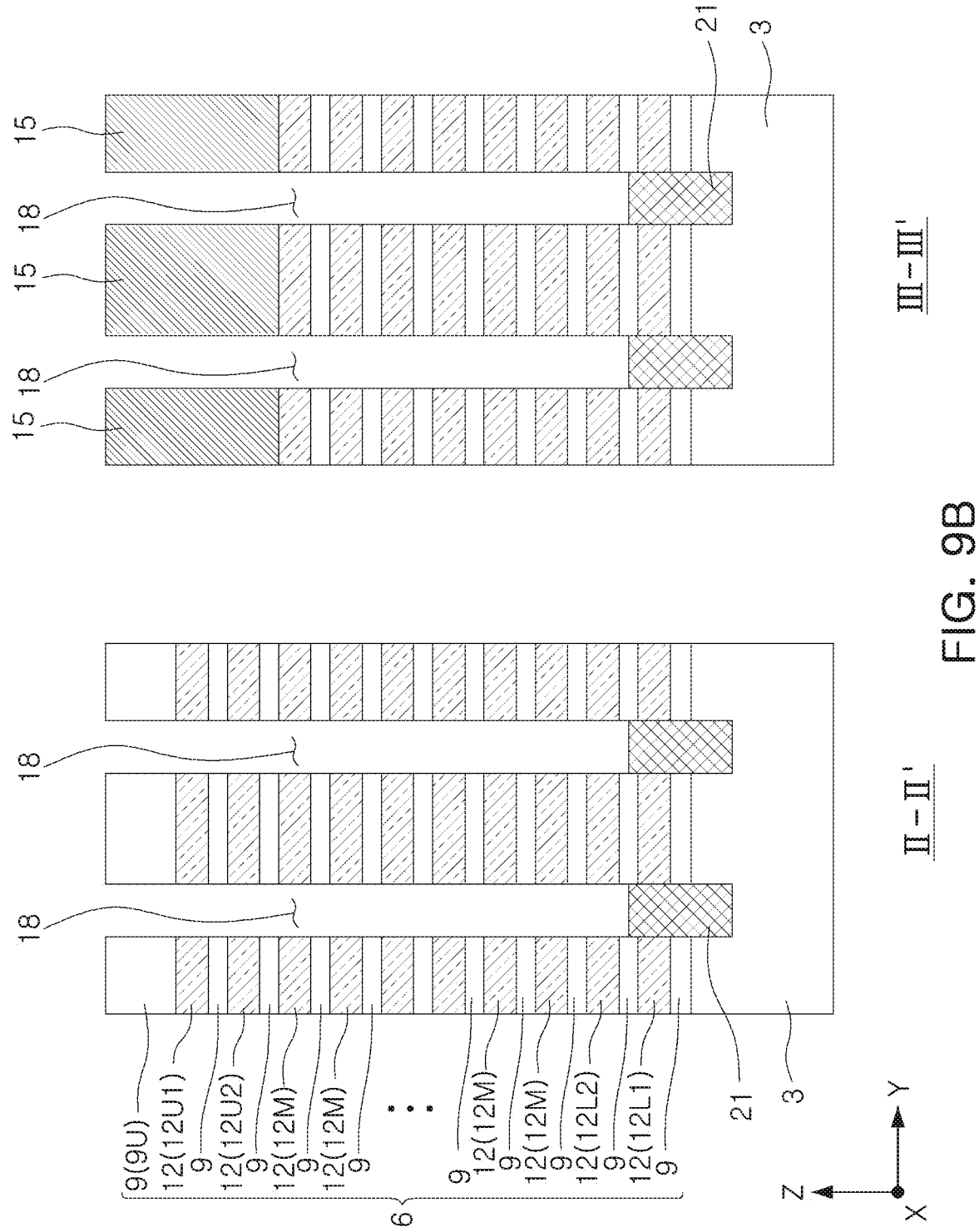

Referring to FIGS. 1, 9A and 9B, a mold structure 6 may be formed on a substrate 3. In some example embodiments, the substrate 3 may be a semiconductor substrate. For example, the substrate 3 may be formed of a semiconductor material such as silicon, or the like. The mold structure 6 may include a plurality of interlayer insulating layers 9 and a plurality of gate layers 12, stacked alternately and repeatedly.

In some example embodiments, the plurality of interlayer insulating layers 9 may be formed of a silicon oxide.

In some example embodiments, the plurality of gate layers 12 may be formed of a material having an etching selectivity with respect to the plurality of interlayer insulating layers 9, for example, a silicon nitride.

In some example embodiments, the plurality of gate layers 12 may be formed of polysilicon.

Among the plurality of interlayer insulating layers 9 and the plurality of gate layers 12, a lowermost layer may be the interlayer insulating layer 9, and an uppermost layer may be the interlayer insulating layer 9U.

In some example embodiments, a part of the plurality of interlayer insulating layers 9 may have a thickness smaller than a thickness of each of the plurality of gate layers 12, and a part of the plurality of interlayer insulating layers 9 may have a thickness greater than the thickness of each of the plurality of gate layers 12. For example, among the plurality of interlayer insulating layers 9, the uppermost interlayer insulating layer 9U may have a thickness greater than the thickness of each of the plurality of gate layers 9, and each of the other interlayer insulating layers 9 may have a thickness smaller than the thickness of each of the plurality of gate layers 12.

In some example embodiments, the plurality of gate layers 12 may include a single or plurality of lower gate layers 12L1 and 12L2, and a plurality of middle gate layers 12M on the single or plurality of lower gate layers 12L1 and 12L2, a single or plurality of upper gate layers 12U1 and 12U2 on the plurality of middle gate layers 12M.

An insulating pattern 15 may be formed to penetrate through the single or plurality of upper gate layers 12U1 and 12U2. For example, the insulating pattern 15 may penetrate through the uppermost interlayer insulating layer 9U and may extend downwardly to penetrate through the single or plurality of upper gate layers 12U1 and 12U2. The insulating pattern 15 may be formed of a silicon oxide.

A plurality of preliminary holes 18 may be formed to penetrate through the mold structure 6. Some of the plurality of preliminary holes 18 may penetrate through the insulating pattern 15, and the remainder of the plurality of preliminary holes 18 may be spaced apart from the insulating pattern 15.

In some example embodiments, the plurality of preliminary holes 18 may expose the substrate 3.

In some example embodiments, when the plurality of gate layers 12 are formed of an insulating material such as a silicon nitride, a semiconductor pattern 21, epitaxially grown from the substrate 3 exposed by the plurality of preliminary holes 18, may be formed. The semiconductor pattern 21 may be formed of an epitaxial semiconductor material grown from the substrate 3. At least a portion of the semiconductor pattern 21 may overlap a lowermost gate layer 12L1, among the plurality of gate layers 12, in a horizontal direction. The semiconductor pattern 21 may be disposed below the plurality of middle gate layers 12M.

Among the plurality of gate layers 12, gate layers 12L2, 12M, 12U1, and 12U2, disposed at a higher level than the semiconductor pattern 21, may be exposed by the plurality of preliminary holes 18.

Figure 10A:
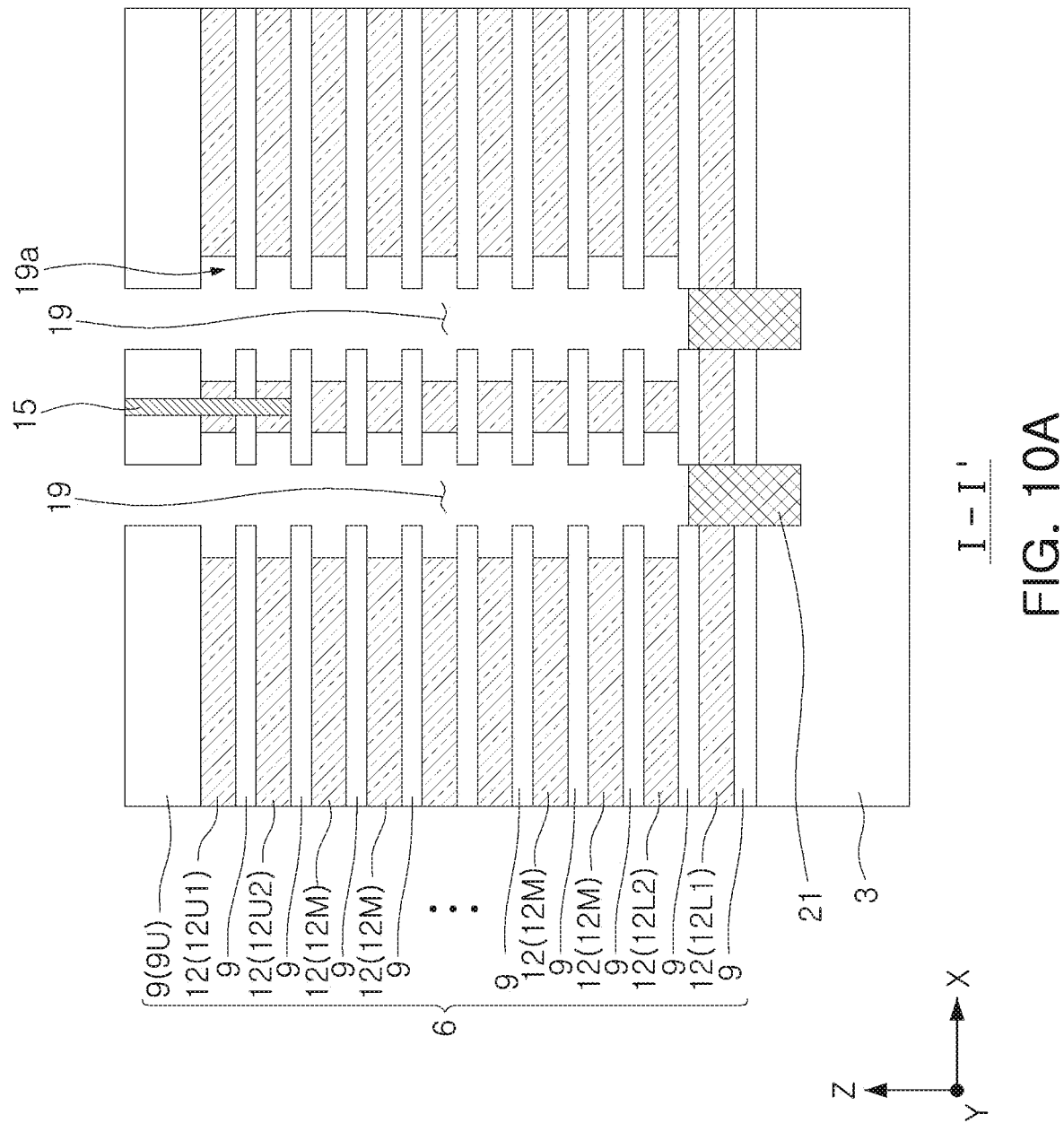
Figure 10B:
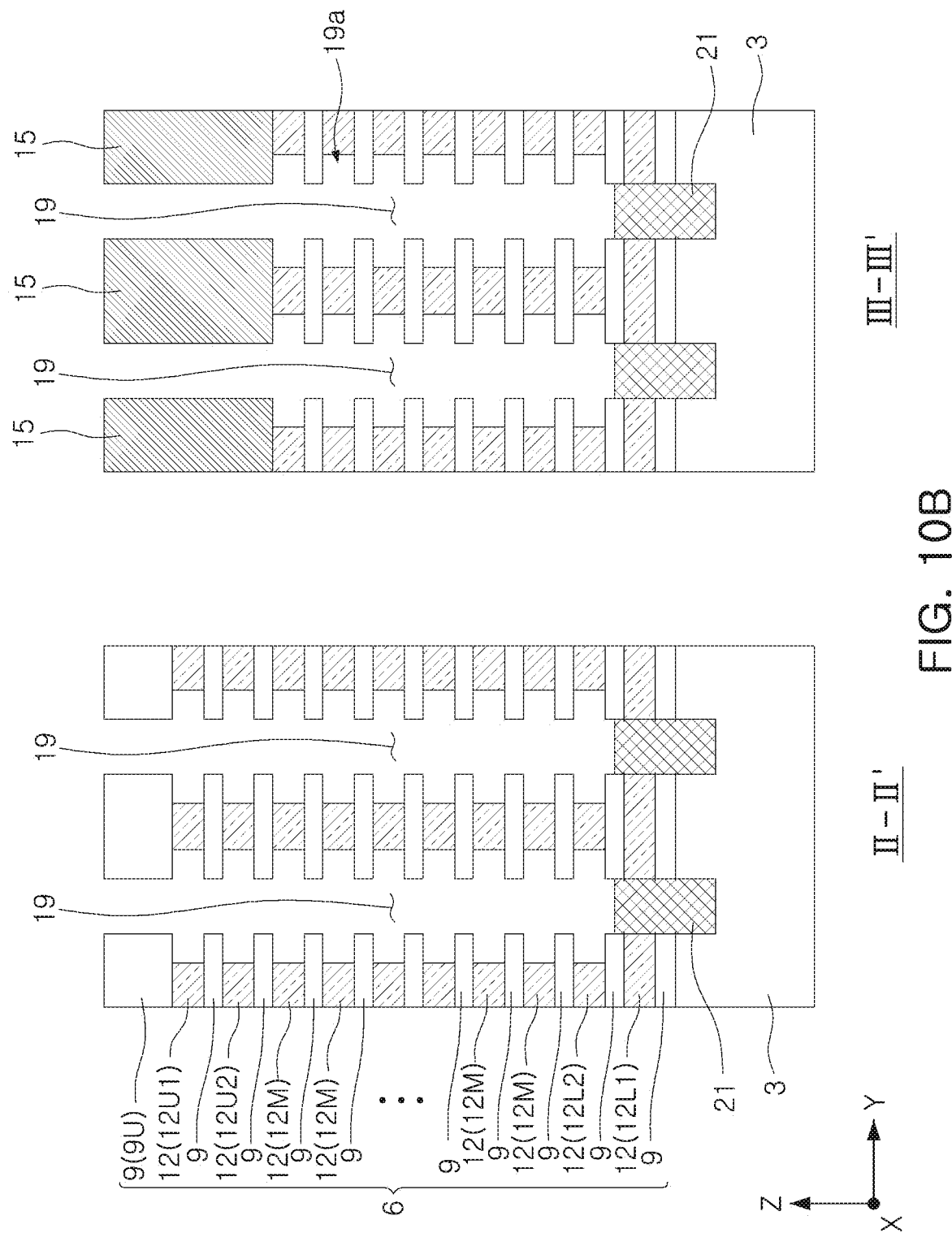

Referring to FIGS. 1, 10A, and 10B, the gate layers 12L2, 12M, 12U1, and 12U2, exposed by the plurality of preliminary holes (18 of FIGS. 9A and 9B), may be partially etched to form a plurality of holes 19 having portions extending in a horizontal direction.

In some example embodiments, partially etched gate layers 12L2, 12M, 12U1, and 12U2 may remain between the plurality of holes 19.

In some example embodiments, when the gate layers 12L2, 12M, 12U1, 12U2 exposed by the plurality of preliminary holes (18 in FIGS. 9A and 9B) are partially etched, partially etched gate layers 12L2, 12M, 12U1, and 12U2 may remain in a region, in which a separation trench (55 of FIG. 14a) is to be formed in a subsequent process, rather than between the plurality of holes 19.

Figure 11A:
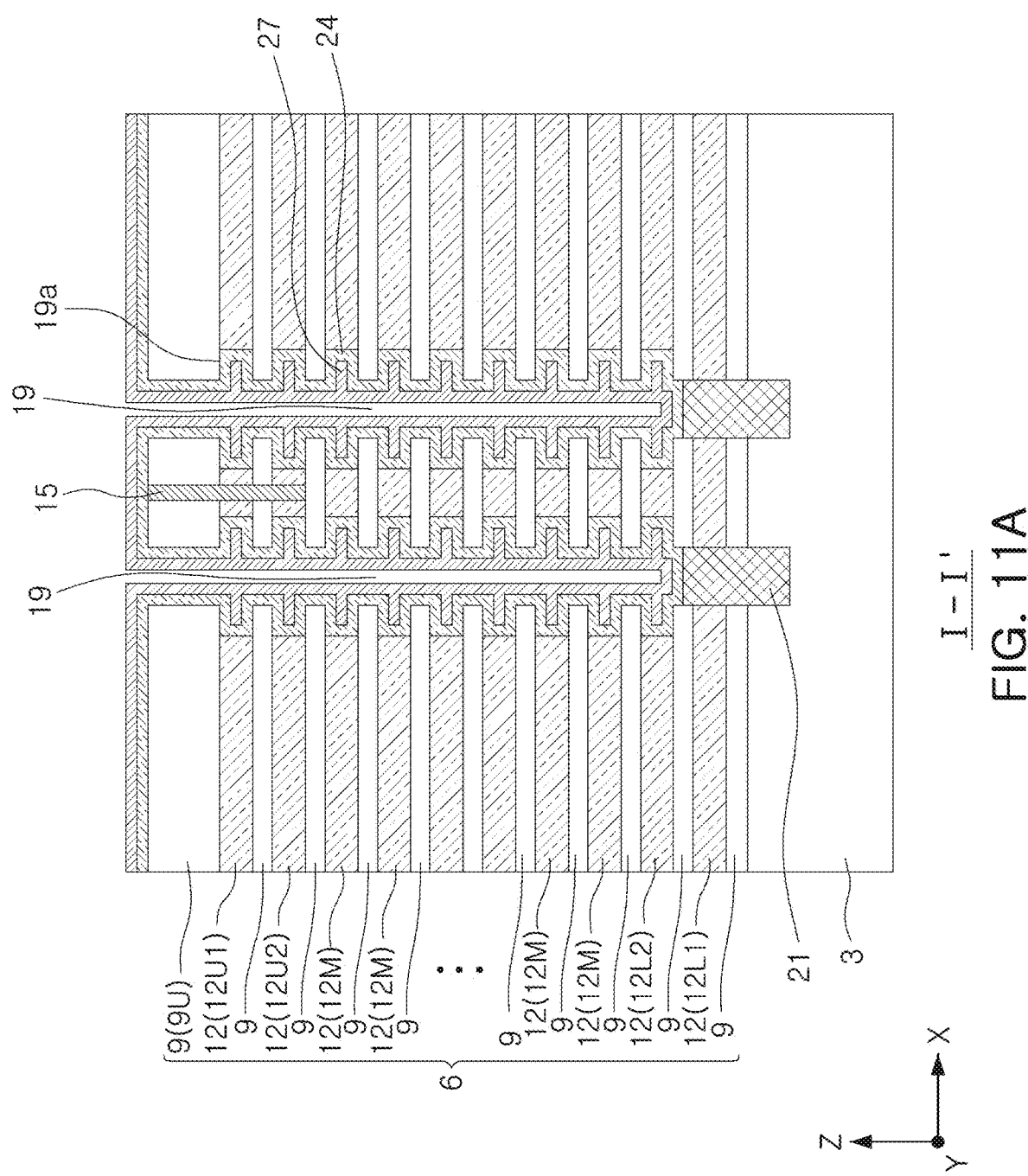

Referring to FIGS. 1, 11A, and 11B, a sacrificial liner 24 and a middle liner 27 may be sequentially formed on the substrate in which the plurality of holes 19 are formed. The sacrificial liner 24 and the middle liner 27 may fill the extending portions 19a of the plurality of holes 19.

The sacrificial liner 24 may be conformally formed along internal walls of the plurality of holes 19.

In each of the plurality of holes 19, the middle liner 27 may include a portion, substantially perpendicular to an upper surface of the substrate 3, and horizontal portions extending into the extending portions 19a from the vertical portion.

Figure 12A:
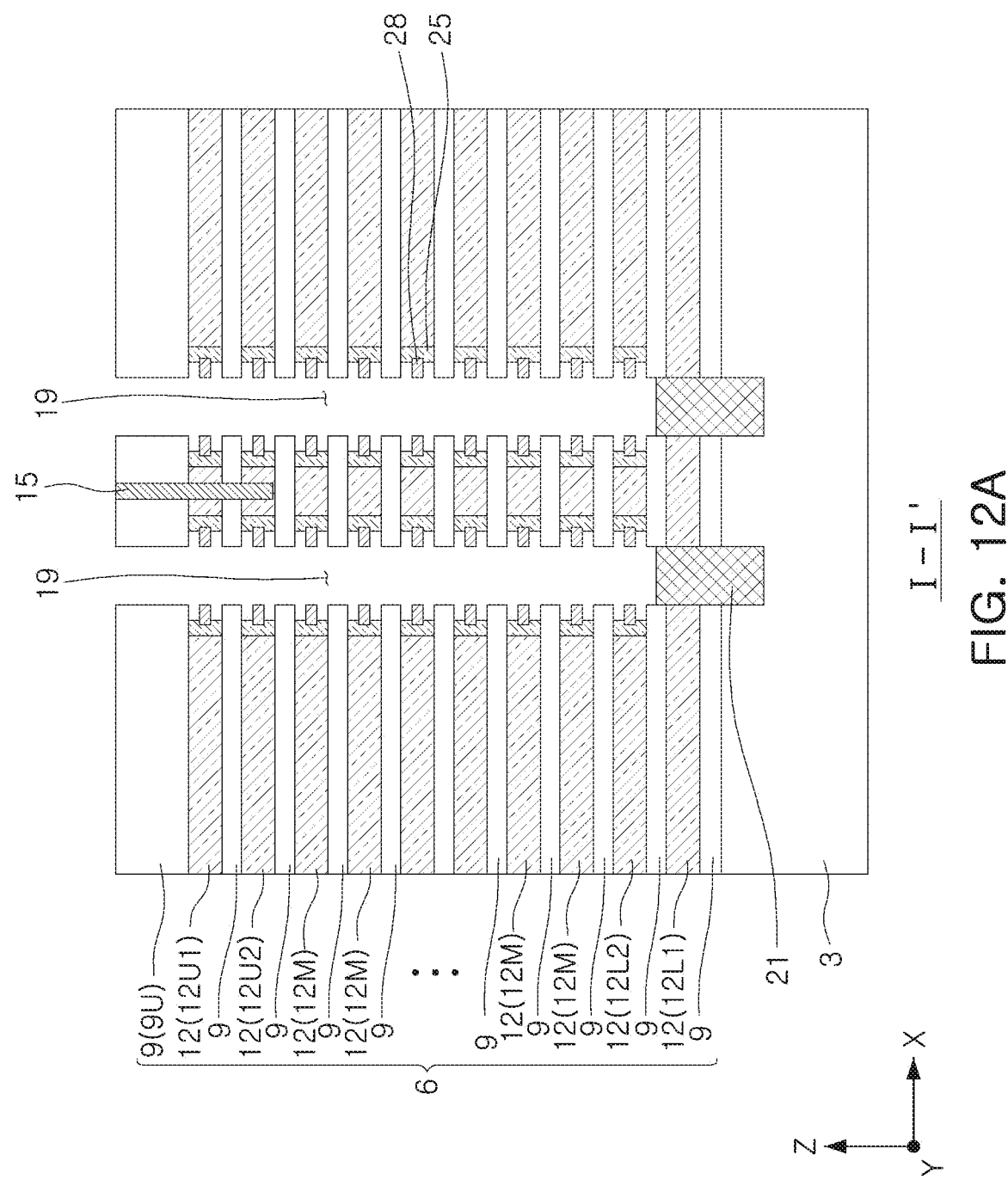
Figure 12B:
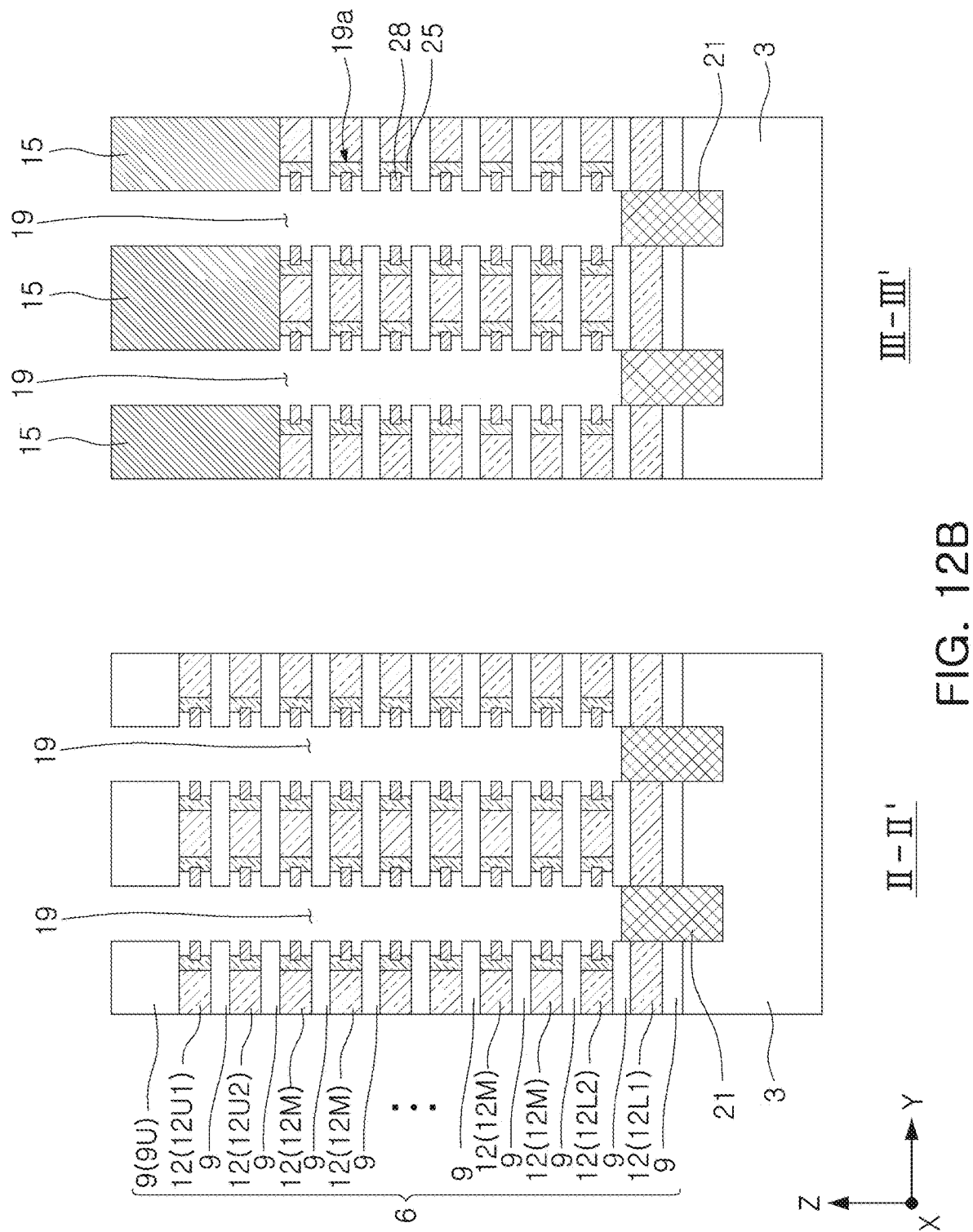

Referring to FIGS. 1, 12A, and 12B, the middle liner 27 may be partially etched to form middle patterns 28 remaining in the extending portions 19a.

The sacrificial liner 24 may be partially etched to form sacrificial patterns 25 remaining in the extending portions 19a. The sacrificial patterns 25 may be recessed further than the middle patterns 28 in the extending portions 19a. One end portion of each of the middle patterns 28 may be in contact with the sacrificial patterns 25 and may be supported by the sacrificial patterns 25, and the other end portion thereof may be exposed. Therefore, each of the middle patterns 28 may be formed to protrude in a direction from the sacrificial patterns 25 to the center of each of the plurality of holes 19.

Figure 13A:
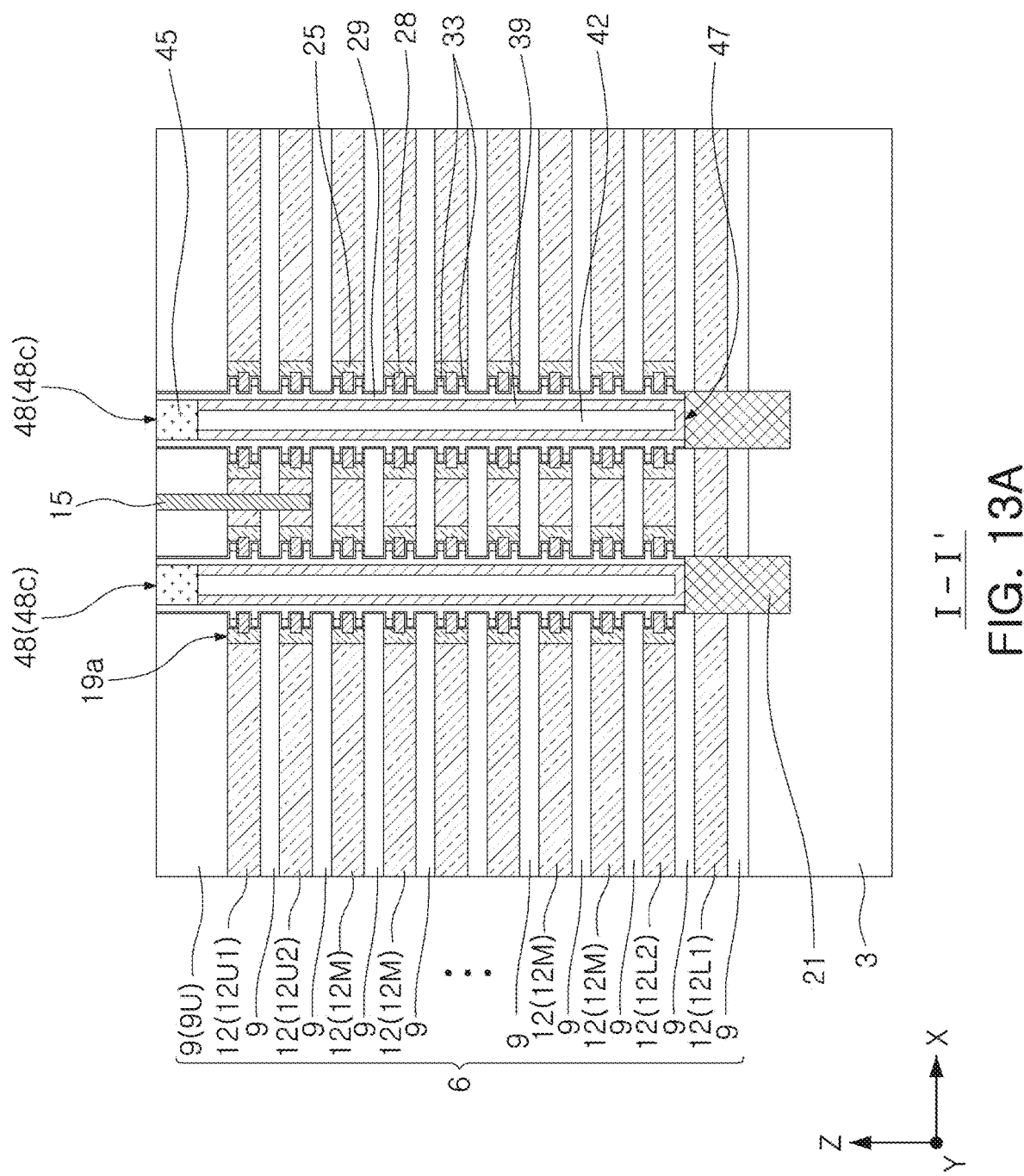
Figure 13B:
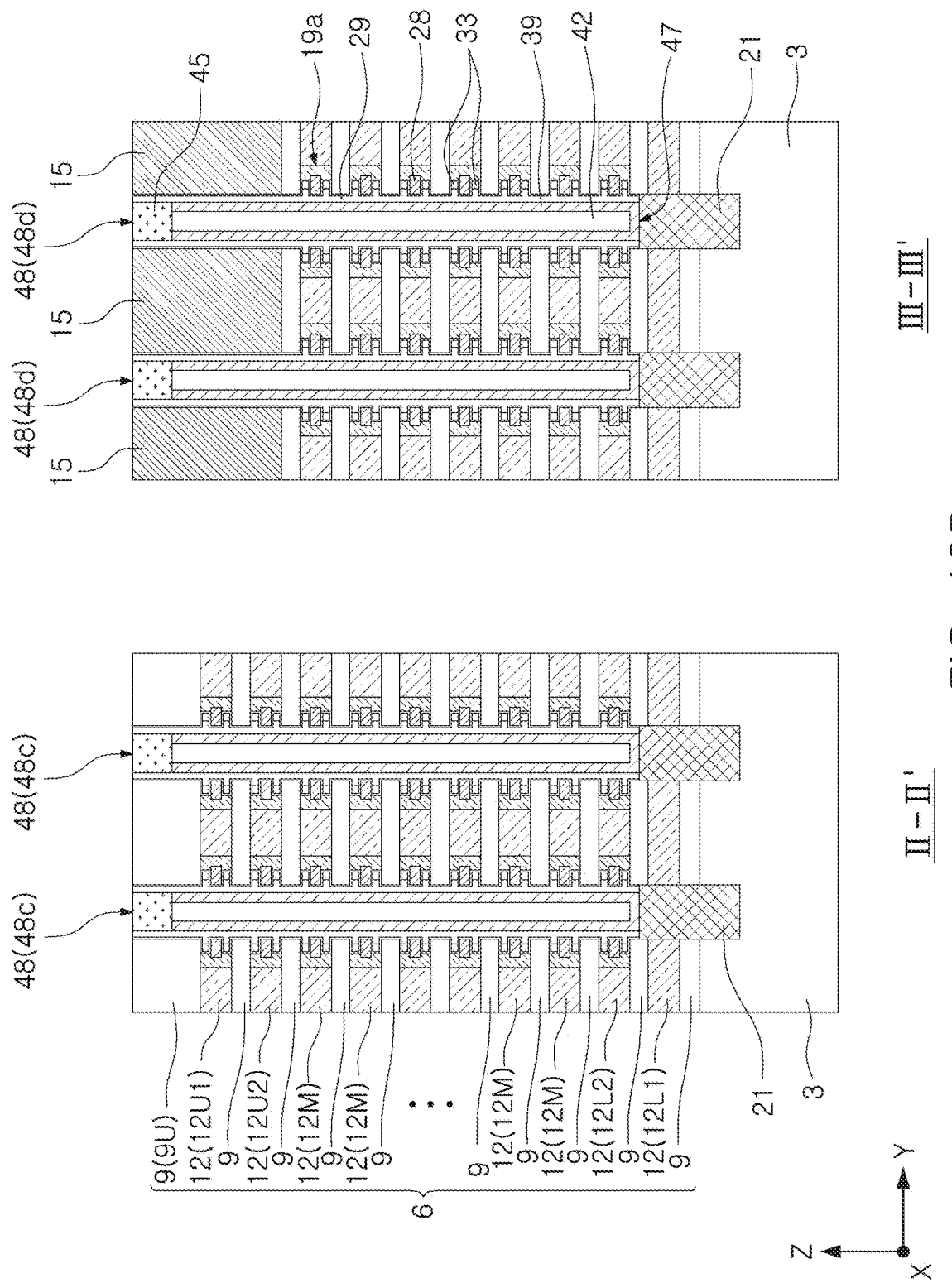

Referring to FIGS. 1, 13A and 13B, vertical structures 48 may be formed in the plurality of holes 19.

In some example embodiments, each of the vertical structures 48 may include a lower vertical region and an upper vertical region 47. The lower vertical region may be the semiconductor pattern 21. The upper vertical region 47 may include a dielectric structure 29, a plurality of data storage patterns 33, a vertical pattern 39, a core pattern 42, and a pad pattern 45.

The forming the upper vertical region 47 may include conformally forming a first dielectric layer (30 of FIG. 3), forming a data storage layer, etching a portion of the data storage layer to form the data storage patterns 33 remaining between the interlayer insulating layers 9 and the middle patterns 28, forming a second dielectric layer (36 of FIG. 3) to cover the first dielectric layer (30 of FIG. 3) and the data storage patterns 33, anisotropically etching the first and second dielectric layers (30 and 36 of FIG. 3) to expose the semiconductor pattern 21, forming a vertical pattern 39 to be in contact with the semiconductor pattern 21 and to cover the first and second dielectric layers (30 and 36 of FIG. 3), forming a core pattern 42 to fill a central portion of the vertical pattern 39, etching a portion of the core pattern 42, and forming a pad pattern 45 to be in contact with the vertical pattern 39. The first and second dielectric layers (30 and 36 of FIG. 3) may be defined as a dielectric structure 29. The pad pattern 45 may be formed at a higher level than an uppermost gate layer 12U1 among the gate layers 12.

Figure 14A:
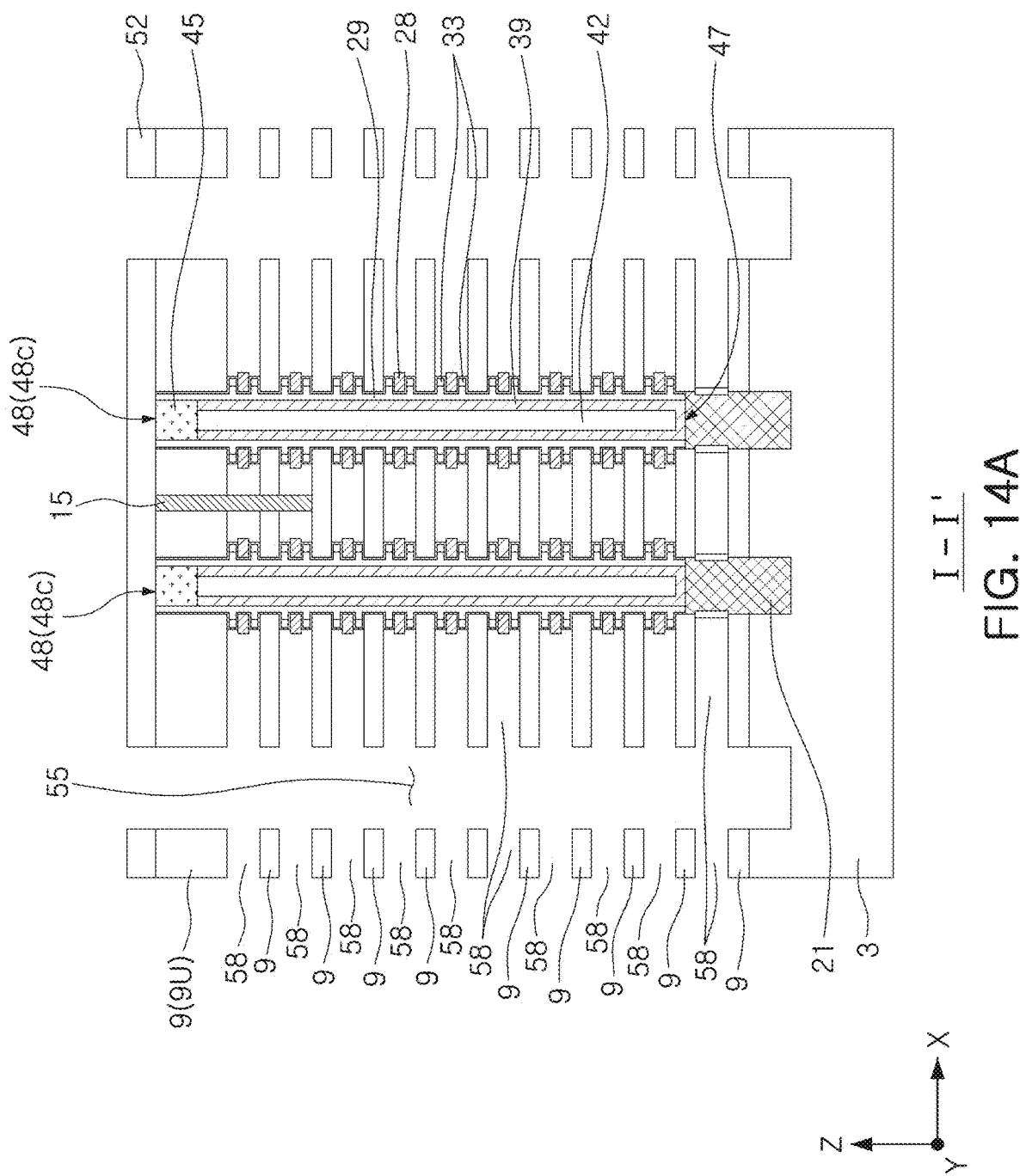

Referring to FIGS. 1, 14A, and 14B, a first capping insulating layer 52 may be formed on the vertical structures 48 and the mold structure (6 in FIGS. 13A and 13B).

Separation trenches 55 may be formed to penetrate through the first capping insulating layer 52 and the mold structure (6 in FIGS. 13A and 13B).

In some example embodiments, the separation trenches 55 may expose the substrate 3.

The separation trenches 55 may expose the gate layers (12 of FIGS. 13A and 13B) of the mold structure (6 of FIGS. 13A and 13B).

The gate layers (12 of FIGS. 13A and 13B), exposed by the separation trenches 55, may be removed, and then the sacrificial patterns 25 may be removed to form empty spaces 58.

Figure 15A:
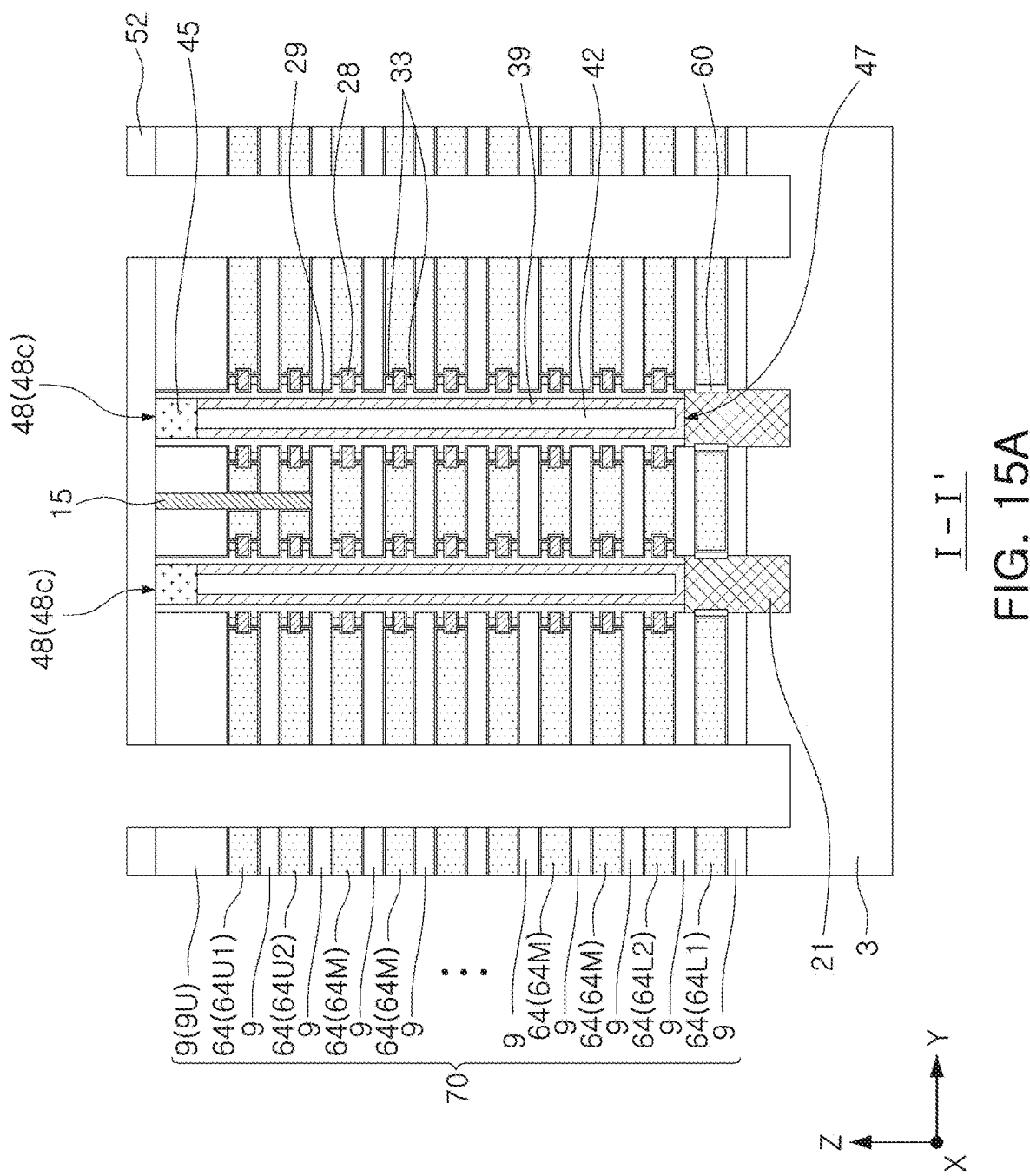
Figure 15B:
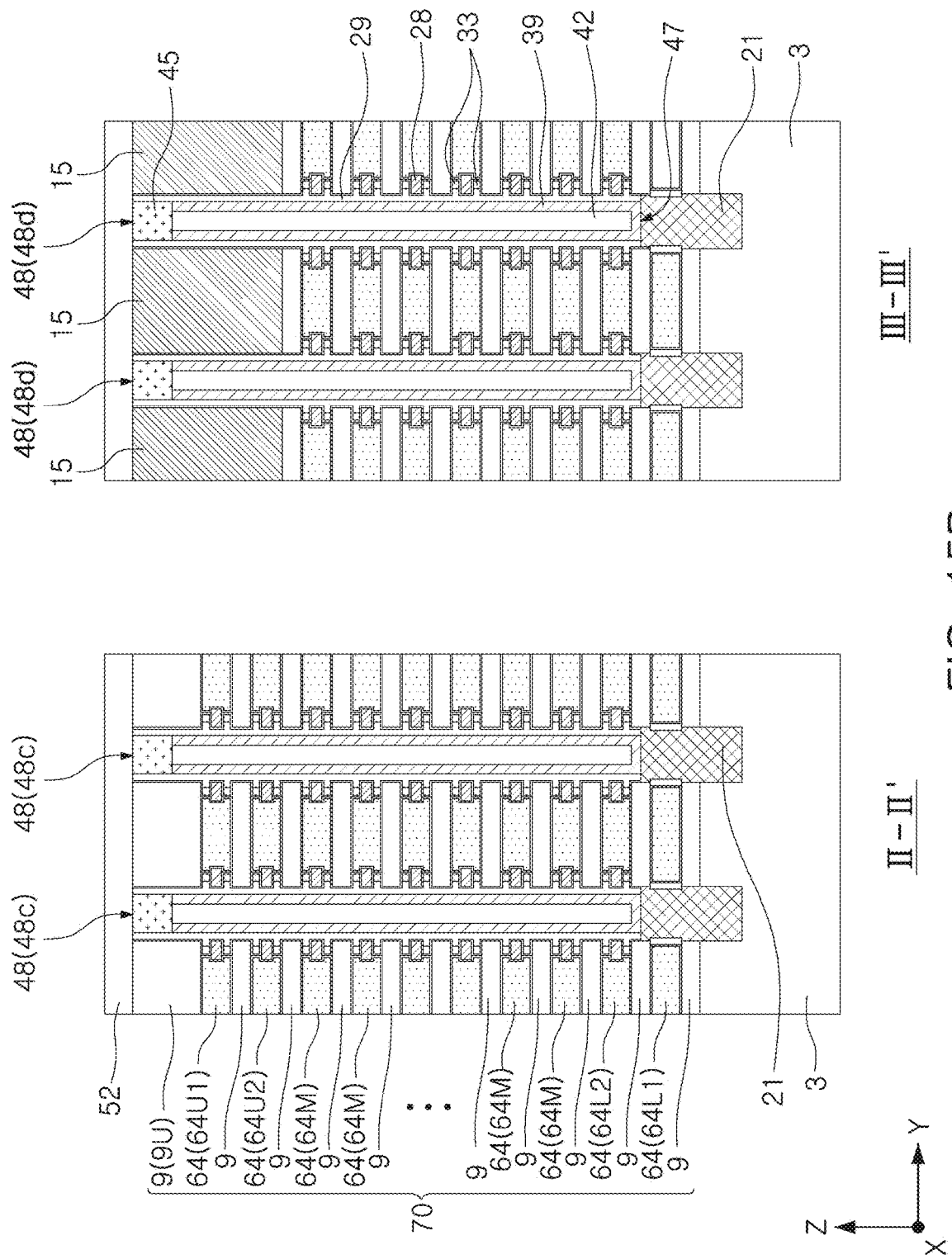

Referring to FIGS. 1, 15A and 15B, a silicon oxide layer 60 may be formed on a side surface of the semiconductor pattern 21 which may be exposed by the empty spaces (58 in FIGS. 14A and 14B).

Gate electrodes 64 may be formed to fill the empty spaces (58 in FIGS. 14A and 14B).

In some example embodiments, before forming the gate electrodes 64, the method may further include forming a third dielectric layer (61 of FIG. 3).

Returning to FIGS. 1, 2A, 2B and 3, separation structures 77 may be formed to fill the separation trenches 55 (FIGS. 15A and 15B). In some example embodiments, the forming the isolation structure 77 may include forming separation spacers 72 on side surfaces of the separation trenches (55 of FIGS. 15A and 15B) and forming separation patterns 75 to fill the separation trenches (55 of FIGS. 15A and 15B).

A second capping insulating layer 80 may be formed to cover the separation structure 77 and the first capping insulating layer 52. A bitline contact plug 79 may be formed to sequentially penetrate through the second capping insulating layer 80 and the first capping insulating layer 52 and to be electrically connected to a pad pattern 45 of a vertical cell structure 48c of the vertical structures 48. A bitline 82 may be formed on the bitline contact plug 79.

In the above-described embodiments, the middle gate electrodes 64M of FIGS. 2A to 4D and 5 to 8, 64Ma of FIGS. 4E to 4F, and 64Mb of FIG. 4G may be wordlines, respectively. The middle gate electrodes 64A of FIGS. 2A to 4D and 5 to 8, 64Ma of FIGS. 4E to 4F, and 64Mb of FIG. 4G may face the plurality of data storage patterns 33, 33a, 33b, and 33c. Any one middle gate electrode 64M of FIG. 3, for example, any one wordline, may face a pair of data storage patterns 33 spaced apart from each other in the vertical direction Z. As described above, charges may be simultaneously trapped in the pair of data storage patterns 33, facing any one wordline (64M in FIG. 3), or may be trapped in any one of the pair of data storage patterns 33 facing any one of wordline (64M in FIG. 3). For example, a programming voltage may be applied to any one wordline (64M in FIG. 3), and a voltage lower than the programming voltage may be applied to another wordline among wordlines adjacent to the wordline (64M in FIG. 3), such that charges may be trapped in any one data storage pattern among the pair of data storage patterns 33. Since the charges may be trapped in both the pair of data storage patterns 33, disposed between the vertical pattern (39 of FIG. 3) which may be a channel layer and the middle gate electrode 64M which may be a wordline, or may be trapped in only one of the pair of data storage patterns 33, memory capacity may be increased. Accordingly, bit density of a memory device such as a NAND flash memory, or the like, may be increased without increasing the number of wordlines of the memory device. Thus, integration density of a semiconductor device may be improved.

As described above, a plurality of data storage patterns, facing a single wordline, may be provided to increase memory capacity without increasing the number of wordlines. Thus, integration density of a semiconductor device may be increased.

While example embodiments have been shown and described above, it will be apparent to those skilled in the art that modifications and variations could be made without departing from the scope of the present inventive concept as defined by the appended claims.

What is claimed is:

1. A semiconductor device comprising:
   a vertical pattern extending in a first direction;
   interlayer insulating layers, spaced apart from each other in the first direction, a side surface of each of the interlayer insulating layers facing a side surface of the vertical pattern;
   a gate electrode between the interlayer insulating layers, a side surface of the gate electrode facing the side surface of the vertical pattern;
   a dielectric structure between the vertical pattern and the interlayer insulating layers with the gate electrode between the interlayer insulating layers; and
   a plurality of data storage patterns between the gate electrode and the vertical pattern, the plurality of data storage patterns spaced apart from each other in the first direction,
   wherein
      the dielectric structure includes a first dielectric layer and a second dielectric layer, the second dielectric layer between the first dielectric layer and the vertical pattern,
      the plurality of data storage patterns are between the first dielectric layer and the second dielectric layer, the first dielectric layer includes a plurality of portions, each portion between a respective each of the plurality of data storage patterns and the gate electrode, and the vertical pattern does not overlap the plurality of data storage patterns in the first direction, and the second dielectric layer includes portions that overlap the first dielectric layer and the interlayer insulating layers in the first direction.

2. The semiconductor device of claim 1, wherein the first dielectric layer extends from each portion along an upper surface and a lower surface of the respective each of the plurality of data storage patterns.

3. The semiconductor device of claim 2, wherein the first dielectric layer extends from each portion, covering the upper surface and the lower surface of the respective each of the plurality of data storage patterns, in a direction away from a side surface of the gate electrode, the side surface facing the respective each of the plurality of data storage patterns.

4. The semiconductor device of claim 2, wherein the first dielectric layer extends from each portion to between the interlayer insulating layers and the second dielectric layer.

5. The semiconductor device of claim 1, further comprising:
a third dielectric layer covering a side surface of the gate electrode, the side surface facing a side surface of the vertical pattern, and the third dielectric layer between the gate electrode and the interlayer insulating layers.

6. The semiconductor device of claim 5, wherein
the third dielectric layer includes a protrusion, the protrusion covering the side surface of the gate electrode and between the plurality of data storage patterns, and
the first dielectric layer is between each of the plurality of data storage patterns and the protrusion of the third dielectric layer and the first dielectric layer is between the second dielectric layer and the protrusion of the third dielectric layer.

7. The semiconductor device of claim 6, further comprising:
an air gap in the protrusion of the third dielectric layer, the air gap defined by the third dielectric layer,
wherein at least a portion of the air gap is between the plurality of data storage patterns.

8. The semiconductor device of claim 1, wherein the gate electrode includes first gate portions, the first gate portions adjacent to the interlayer insulating layers, and a second gate portion between the first gate portions, and
the first gate portions face the plurality of data storage patterns.

9. The semiconductor device of claim 8, wherein each of the first gate portions includes a gate protrusion, the gate protrusion protruding further than the second gate portion in a direction of the vertical pattern.

10. The semiconductor device of claim 8, wherein the second gate portion includes a gate protrusion protruding further than the first gate portions in the direction of the vertical pattern.

11. The semiconductor device of claim 8, wherein a thickness of each of the first gate portions is different from a thickness of the second gate portion.

12. The semiconductor device of claim 11, wherein the thickness of each of the first gate portions is greater than the thickness of the second gate portion.

13. The semiconductor device of claim 11, wherein the thickness of each of the first gate portions is less than the thickness of the second gate portion.

14. The semiconductor device of claim 8, further comprising:
a middle pattern between the second gate portion of the gate electrode and the dielectric structure,
wherein at least a portion of the middle pattern is between the plurality of data storage patterns.

15. The semiconductor device of claim 1, further comprising a core pattern, wherein
each of the plurality of data storage patterns is a charge trap layer of a nonvolatile memory device,
the vertical pattern includes a semiconductor layer, and
the vertical pattern is between the core pattern and the second dielectric layer.

16. The semiconductor device of claim 1, wherein the vertical pattern includes a plurality of protrusions, each protrusion extending in a direction to an adjacent one of the plurality of data storage patterns.

17. A semiconductor device comprising:
a substrate;
a vertical pattern on the substrate and extending n a first direction perpendicular to an upper surface of the substrate;
interlayer insulating layers, spaced apart from each other in the first direction, a side surface of each of the interlayer insulating layers facing a side surface of the vertical pattern;
a single gate electrode between the interlayer insulating layers, a side surface of the single gate electrode facing the side surface of the vertical pattern;
a dielectric structure between the vertical pattern and the interlayer insulating layers with the single gate electrode between the interlayer insulating layers; and
a plurality of data storage patterns between the single gate electrode and the vertical pattern in a second direction, the plurality of data storage patterns spaced apart from each other in the first direction,
wherein
the second direction is perpendicular to the first direction,
the single gate electrode includes a plurality of first gate portions and a second gate portion between the plurality of first gate portions,
the plurality of first gate portions face the plurality of data storage patterns,
each of the plurality of first gate portions includes a protrusion protruding further than the second gate portion in a direction of the vertical pattern, or the second gate portion includes a protrusion protruding further than the plurality of first gate portions in a direction of the vertical pattern
the plurality of data storage patterns include a lower data storage pattern and an upper data storage pattern on the lower data storage pattern, the single gate electrode includes a center portion between an upper surface and a lower surface of the single gate electrode,
an upper surface of the lower data storage pattern is at a lower level than the center portion of the single gate electrode and is at a higher level than the lower surface of the single gate electrode,
and a lower surface of the upper data storage pattern is at a higher level than the center portion of the single gate electrode and is at a lower level than the upper surface of the single gate electrode.

18. The semiconductor device of claim 17, wherein the dielectric structure includes a first dielectric layer and a second dielectric layer, the second dielectric layer between the first dielectric layer and the vertical pattern, the second dielectric layer includes portions that overlap the first dielectric layer and the interlayer insulating layers in the first direction, the first dielectric layer and the second dielectric layer are in contact with each other between the second gate portion and the vertical pattern and spaced apart from each other between the plurality of first gate portions and the vertical pattern, and the plurality of data storage patterns are between the first dielectric layer and the second dielectric layer between the plurality of first gate portions and the vertical pattern.

19. A semiconductor device comprising:

a stack structure on a substrate; and a vertical structure penetrating through the stack structure in a first direction, wherein the stack structure includes a plurality of interlayer insulating layers and a plurality of gate electrodes, stacked alternately and repeatedly, at least a portion of the vertical structure includes a vertical pattern, a first dielectric layer, a second dielectric layer, and a plurality of data storage patterns, the first dielectric layer is between a side surface of the vertical pattern and the stack structure, the second dielectric layer is between the side surface of the vertical pattern and the first dielectric layer, the plurality of data storage patterns is between the first dielectric layer and the second dielectric layer, each of the plurality of data storage patterns has a first side surface and a second side surface, opposing each other, the first dielectric layer covers the first side surface, an upper surface, and a lower surface of each of the plurality of data storage patterns, and the second dielectric layer includes portions that overlap the first dielectric layer and the interlayer insulating layers in the first direction.

20. The semiconductor device of claim 19, wherein the second dielectric layer covers the second side surface of each of the plurality of data storage patterns, and the first dielectric layer extends from a portion, the portion covering the upper surface and the lower surface of each of the plurality of data storage patterns, in a direction away from gate electrodes facing each of the plurality of data storage patterns.

\* \* \* \* \*